United States Patent
Balakrishnan

(10) Patent No.: US 11,043,947 B1
(45) Date of Patent: Jun. 22, 2021

(54) ENERGY EFFICIENT POWER DISTRIBUTION CIRCUITS FOR PROTECTION OF SENSITIVE INFORMATION

(71) Applicant: Arm Limited, Cambridge (GB)

(72) Inventor: Srinivasan Balakrishnan, Bangalore (IN)

(73) Assignee: ARM LIMITED, Cambridge (GB)

( * ) Notice: Subject to any disclaimer, the term of this patent is extended or adjusted under 35 U.S.C. 154(b) by 0 days.

(21) Appl. No.: 16/745,205

(22) Filed: Jan. 16, 2020

(51) Int. Cl.
*H03K 17/30* (2006.01)
*H03K 19/003* (2006.01)
*H03K 17/0812* (2006.01)
*H03K 19/00* (2006.01)

(52) U.S. Cl.
CPC . *H03K 19/00384* (2013.01); *H03K 17/08122* (2013.01); *H03K 17/302* (2013.01); *H03K 19/0013* (2013.01)

(58) Field of Classification Search
CPC ........... H03K 19/00384; H03K 17/302; H03K 17/08122; H03K 19/0013
See application file for complete search history.

(56) References Cited

U.S. PATENT DOCUMENTS

| | | | |
|---|---|---|---|
| 6,441,663 B1 | 8/2002 | Chuang et al. | |
| 7,915,948 B2 * | 3/2011 | Nishimura | H03K 5/2481 327/524 |
| 9,746,501 B1 | 8/2017 | Chang | |
| 2018/0336372 A1 | 11/2018 | Fleming et al. | |

OTHER PUBLICATIONS

Ke Lin et al., "A PVT-independent Schmitt trigger with fully adjustable hysteresis threshold voltages for low-power 1-bit digitization applications", IEICE Electronics Express, Aug. 23, 2016, 9 pages, vol. 13, No. 17.
Carlos Tokunaga et al., "Securing Encryption Systems With a Switched Capacitor Current Equalizer", IEEE Journal of Solid-State Circuits, Jan. 2010, 9 pages, vol. 45, No. 1.
Guoqiang Hang et al., "Neuron-MOS Based Schmitt Trigger with Controllable Hysteresis", 2012 Eighth International Conference ON Computational Intelligence and Security (CIS), IEEE, Nov. 17, 2012, 2 pages.
"Partial International Search Report", Application No. PCT/GB2020/053290, dated Apr. 7, 2021, p. 16.

* cited by examiner

Primary Examiner — Jung Kim
(74) Attorney, Agent, or Firm — Talem IP Law, LLP

(57) ABSTRACT

A power distribution circuit can include a comparator circuit that is formed of an inverter. The inverter can be configured with a trip voltage value (Vtrip) different than half a supply voltage value (VDD/2) for further energy efficiencies in discharging a charge storage device used in the power distribution circuit to gain security.

11 Claims, 16 Drawing Sheets

US 11,043,947 B1

ENERGY EFFICIENT POWER DISTRIBUTION CIRCUITS FOR PROTECTION OF SENSITIVE INFORMATION

BACKGROUND

Integrated circuits (ICs) may include designs that contain sensitive information. An example of such sensitive information is the secret key information used in crypto engine implementations (such as AES). Attempts to access secure or sensitive information (cryptographic or otherwise) on an IC may be carried out via unauthorized or unintended access methods for the circuit. Such methods include side channel attacks, where an adversary seeks information about the secure or sensitive information from the circuit's power signatures or electromagnetic signatures or other physical signatures.

BRIEF SUMMARY

Energy efficient power distribution circuits for protection of sensitive information are provided. The described power distribution circuits include energy efficient comparator circuitry with low power inverters.

The energy efficient comparator circuitry can include an inverter stage configured with a trip voltage value greater than half a supply voltage value (VDD/2) and a buffer stage coupled to an output of the inverter stage. The trip voltage (Vtrip) is the input voltage point in the voltage transfer characteristic graph of an inverter, such as a complementary metal oxide semiconductor (CMOS) inverter, at which the output voltage is equal to the input voltage. The inverter's output state is changed when the input crosses Vtrip.

In one implementation, Vtrip of the inverter of the inverter stage is used as the reference voltage for the comparator.

In another implementation, the inverter stage is formed of a reference voltage stage and an input stage, both including inverters. The reference voltage stage is configured to achieve process and temperature variation tolerance and the input stage is configured to provide Vtrip>VDD/2, where Vtrip is equal to the Vref, where Vref is the input voltage of the reference stage.

A power distribution circuit can include the energy efficient comparator circuitry with low power inverters to control a partial discharge of a charge storage device. The charge storage device is used to provide power to sensitive or secure circuitry and is replenished by a voltage supply. The comparator monitors the voltage of the charge storage device and triggers (e.g., opens/turn-off) a shunt switch when the voltage of the charge storage device falls below the reference voltage. The power distribution circuit can further include at least a supply trigger and a logic trigger. The supply trigger controls when the charge storage device is coupled to a supply voltage, for example, to replenish the voltage on the charge storage device. The logic trigger controls when the charge storage device is coupled to the circuitry being powered by the power distribution circuit so that the circuitry can be powered using the voltage on the charge storage device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 7A-7F show the VTC of Vo1 (e.g., FIGS. 7A-7C) and Vout (e.g., FIGS. 7D-7F) across Process (SS, FF, SF, FS, TT) and Temperature (−40 C, 25 C, 125 C) at a supply voltage of 0.99V.; and FIGS. 7G-7I show Vbias across different Vref, Process (SS, FF, SF, FS, TT) and Temperature (−40 C, 25 C, 125 C) at a supply voltage of 0.99V.

DETAILED DESCRIPTION

Energy efficient power distribution circuits for protection of sensitive information are provided. The described power distribution circuits include energy efficient comparator circuitry with low power inverters.

Figure 1A:
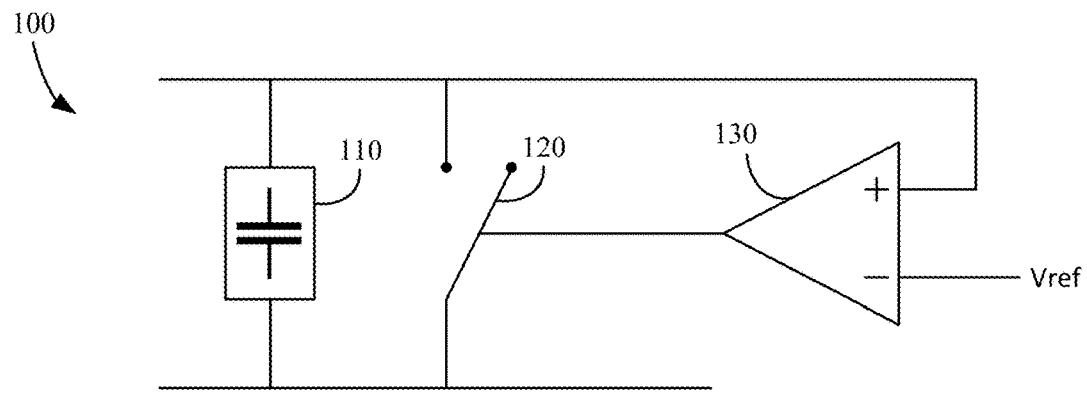
FIG. 1A illustrates an example circuit diagram of a simplified power distribution circuit.

FIG. 1A illustrates an example circuit diagram of a simplified power distribution circuit. The example simplified power distribution circuit 100 includes a charge storage device (e.g., capacitor) 110, switch 120, and comparator 130. The charge storage device 110 provides power (via an internal power node) to at least a portion of a circuit that may contain secure or sensitive information; and is replenished by a power supply (not shown) according to any suitable timing or trigger. To make it difficult to read circuit operations from the depletion and replenishment of the charge storage device 110, a discharge operation from a shunt (e.g., via switch 120) can be performed such that the replenishment of the charge storage device does not correspond to consumption by the circuit.

The comparator 130 is coupled to the charge storage device to receive a voltage value of the charge storage device and output a signal to the shunt switch 120. The comparator 130 monitors the voltage of the charge storage device 110, which triggers (e.g. open/turn-off) the shunt switch 120 when the voltage falls below a threshold voltage Vref. This enables the voltage across the charge storage device 110 to be at a same voltage value each time the charge storage device 110 is replenished. Such an arrangement can be used to provide isolation between the power consumption of the circuit and the power supply lines, thereby providing protection from side channel attacks.

Figure 1B:
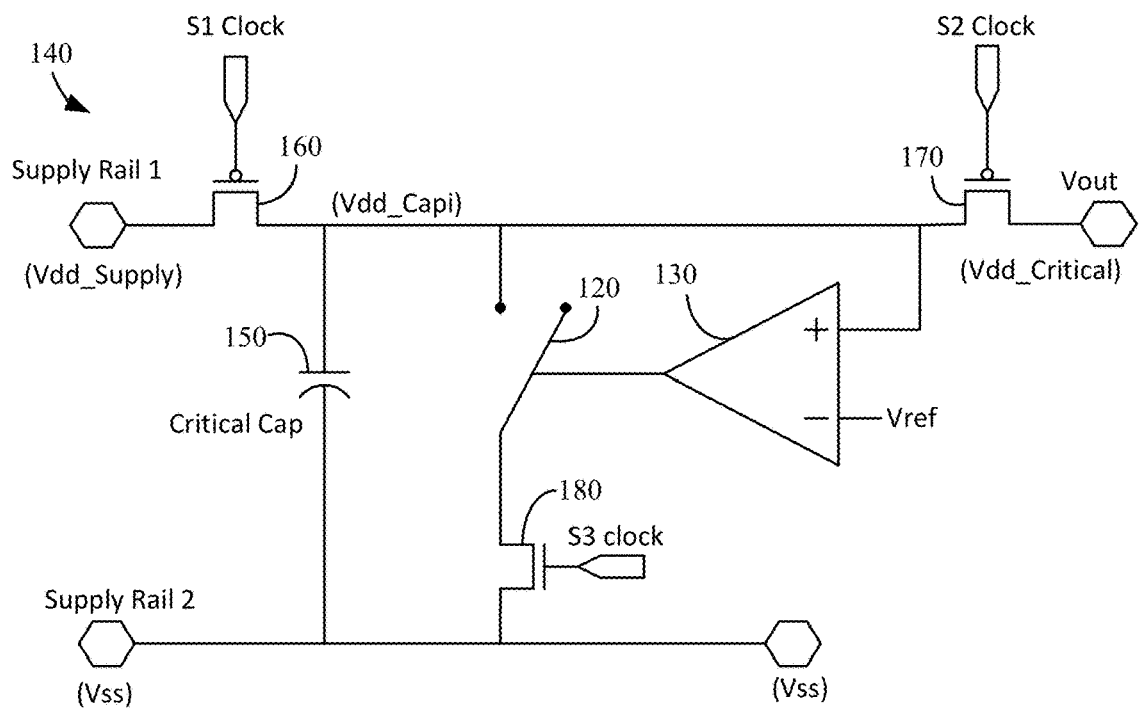
FIG. 1B illustrates an example implementation of a switched capacitor circuit for a power distribution circuit.

FIG. 1B illustrates an example implementation of a switched capacitor circuit for a power distribution circuit. Vdd_Supply is the input supply voltage and Vdd_Critical is the output of the switched capacitor circuit which powers the sensitive or secure circuitry. The example implementation of a switched capacitor circuit 140 includes a critical capacitor 150 for the charge storage device 110, the shunt switch 120, and the comparator 130. In addition, the switched capacitor circuit 140 includes a first switch 160 controlled by S1 clock, a second switch 170 controlled by S2 clock, and a third switch 180 controlled by S3 clock.

A challenge with the technique available using a switched capacitor circuit is the power overhead caused by the amount of power the circuit consumes. For internet of things (IoT), embedded subscriber identity module (eSIM), and integrated subscriber identity module (iSIM) applications, as well as other low voltage, low power and battery-operated applications, any improvement to power consumption while providing the security performance available via the switched capacitor circuit is desirable. Advantageously, the energy efficient comparator circuitry with low power inverters described herein can contribute to the aforementioned power savings. Furthermore, the comparator circuitry described herein can be used to implement partial discharging of the charge storage device 110 (or critical capacitor 150) via shunt switch 120 as illustrated in FIGS. 1A and 1B, enabling less charge wastage.

In detail, with respect to FIG. 1B, for good power savings, the comparator 130 should be sufficiently fast so that when Vdd_Capi equals Vref, the comparator 130 turns off the S3 path immediately. In a partial discharge scheme that can be carried out for the described switched capacitor circuit, the Vdd_Capi is discharged down to a level set by Vref instead of fully discharging (to the second supply rail e.g., Vss). When the critical capacitor 150 is discharged the maximum voltage, then there is a significant amount of voltage that the critical capacitor 150 needs to be charged to reach Vdd_Supply by the time the first switch 160 is turned on by S1 clock. In addition, by making Vref closer to Vdd_critical (e.g., greater than Vdd_Supply/2), there is further power savings. Of course, due to finite time delay of the comparator 130 and switches (e.g., switches 120 and 180) involved in S3 phase of the cycle, Vdd_Capi is always going to be below Vref at the end of the S3 phase, which results in less power saving than expected by design.

A "Holistic design" of the comparator 130 and the MOSFET (metal oxide semiconductor field effect transistor) sizes in, for example, the shunt switch 120 and third switch 180 improves the power saving. As mentioned above, the time duration of the S3 phase (a constant fixed by design) >Comparator delay+time to discharge the Critical Cap to Vref+Switching and parasitic delays. Accordingly, the sum of all the 3 different delay components must be less than time duration of S3 phase. The difference of values of Vdd_Capi when it reaches Vref and when the S3 path (e.g., switch 120) is switched off by the comparator 130, is directly proportional to the delay of comparator 130 and the rate of discharge through the S3 path switches. If the comparator's delay is less, it is possible to size the MOSFETs forming the S3 path switch(es) to reduce the discharge rate. This means letting Vdd_Capi reach close to Vref at the end of S3 phase, which results in the comparator quickly turning off S3 before the end of S3 phase. This slow rate of discharge also ensures less charge wastage happening during the delay period of comparator 130.

Alternatively, increasing the time duration of S3 phase relaxes the delay specification of comparator 130, making it affordable to discharge Critical Cap 150 slowly and saves more power. In this case, the time durations of the S1 clock and the S2 clock are reduced. Vice-versa (i.e., saving less power) is true when comparator 130 has larger delay and is mostly the case in practice. This is because the Critical Cap 150 may be implemented as a MOS Capacitor (to get higher capacitance density), which has a non-linear C-V (Capacitance to Voltage) characteristics. As in any standard MOS Capacitor, the capacitance falls at a faster rate as the voltage across it goes down during discharge. This smaller capacitance results in smaller charge conservation (Q=CV) and hence less power saving. In addition, even with improvements in power savings available by using the partial discharge technique, the critical capacitor 150 is dependent on C-V characteristics, which affects the power savings. Hence, it is desirable to have a fast comparator which lessens the designer's dependency on the physical behavior of Capacitor 150 to save power.

Figure 2:
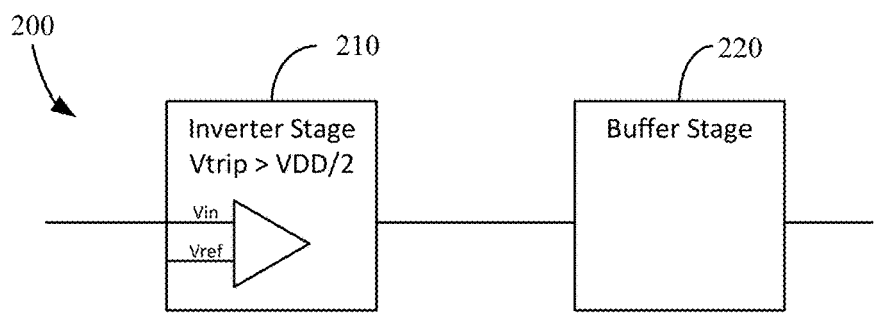
FIG. 2 illustrates a functional diagram of an energy efficient comparator circuit.

FIG. 2 illustrates a functional diagram of an energy efficient comparator circuit. The comparator circuit 200 can be used to implement comparator 130 and includes an inverter stage 210 configured with a trip voltage value different than half a supply voltage value and a buffer stage 220. The inverter stage 210 includes a pull-up network and a pull-down network, where the trip voltage value is set by the drive strength (or ON resistance) ratio of the pull-up network and the pull-down network. In some cases, the inverter stage 210 can be implemented with a complementary metal oxide semiconductor (CMOS) inverter (with the pull-up network formed of p-channel MOSFETs (PMOS transistors) and the pull-down network formed of n-channel MOSFETs (NMOS transistors). A CMOS inverter is a digital circuit. However, it is possible to use a CMOS inverter to compare an analog voltage with respect to a reference value.

The trip voltage (Vtrip) is the input voltage point in the voltage transfer characteristic graph of the inverter at which the output voltage is equal to the input voltage. The inverter's output state is changed when the input crosses Vtrip. Usually, for digital applications, Vtrip is set to VDD/2 (half the supply voltage value) in order to achieve large noise margin for both logic 1 (high) and logic 0 (low). For the analog comparator application described herein, Vtrip of the inverter is set to be different than VDD/2 (e.g., a value of reference voltage with which the input voltage is to be compared).

Circuits implemented with CMOS devices generally are considered to have relatively low power consumption. In addition, a CMOS inverter can be configured with a trip voltage value greater than half a supply voltage value, which as discussed herein can further reduce power consumption (and positively affect timing delay with respect to the needs of the power distribution circuit).

The comparator circuit 200 may also be implemented using advanced CMOS technologies and technologies other than CMOS (e.g., outside of bulk CMOS or SOI CMOS) using suitable design techniques. For example, in some cases, the inverter of the comparator circuit 200 may be implemented to obtain higher Vtrip using SLVT(super low threshold voltage) P-type FET for stronger pull-up and LVT(low threshold voltage)/SVT(standard threshold voltage)/HVT(high threshold voltage) N-type FET for weaker pull-down. In yet other implementations, a single PFET with a larger width and a single NFET with a smaller width can be used.

In one implementation of inverter stage 210, the trip voltage (Vtrip) of the inverter functions as the reference voltage Vref. This implementation is referred to as a skewed inverter comparator. By providing Vtrip greater than VDD/2 and using Vtrip as Vref, it is possible to perform partial discharge of the charge storage device in a switched capacitor circuit.

Figure 3A:
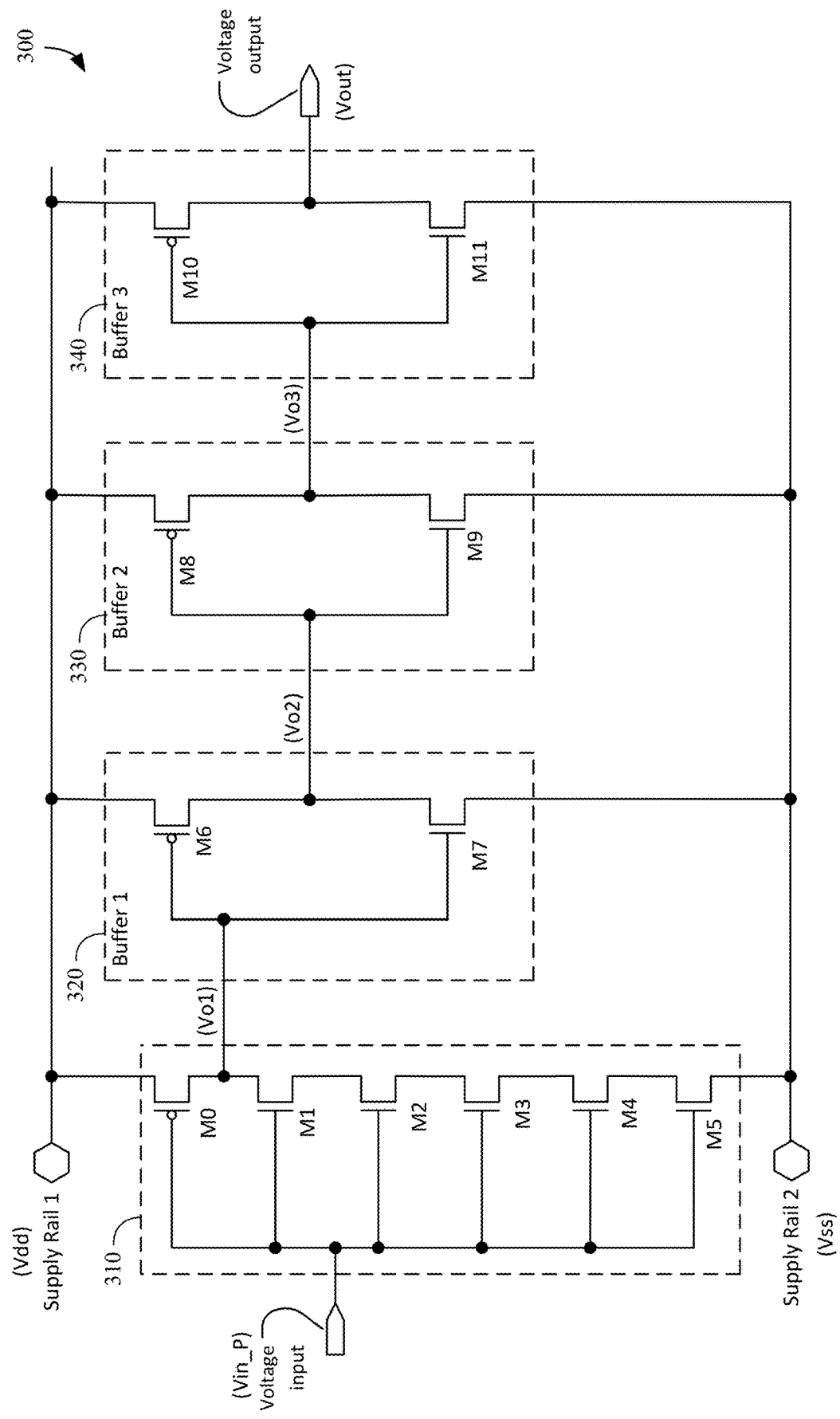
FIG. 3A illustrates an example skewed inverter comparator.

FIG. 3A illustrates an example skewed inverter comparator. A skewed inverter comparator 300 includes an inverter stage formed of a CMOS inverter 310 that is coupled to receive an input voltage (Vin_P) and a buffer stage that is coupled to an output of the inverter stage. The CMOS inverter 310 includes at least one PMOS transistor and at least one NMOS transistor configured to cause the CMOS inverter to skew such that Vtrip>VDD/2. Accordingly, CMOS inverter 310 can be referred to as a skewed inverter. The CMOS inverter 310 can be made to skew such that Vtrip>VDD/2 by having the number of NMOS transistors greater than the number of PMOS transistors. In the illustrated example, the CMOS inverter 310 has one PMOS transistor (M0) and five NMOS transistors (M1, M2, M3, M4, M5).

In some cases, the CMOS inverter 310 can be made to skew such that Vtrip>VDD/2 by adjusting the sizing of the at least one PMOS transistor and the at least one NMOS transistor. Indeed, different strengths of pull-up and pull-down networks can be obtained by using various dimensions (channel length and width) of MOSFETs as well as using various MOSFET choices with different Threshold Voltages (Vth) available in a fabrication technology. For example, using Low Vth MOSFETs can provide lower ON resistance and High Vth MOSFETs, higher ON resistance. A higher resistance network (i.e. lower drive strength) can also be obtained by connecting more than two MOSFETs in series, such as in the case shown in FIG. 3A. The back-body effect of MOSFETs also helps in increasing the ON resistance of the network.

To maintain a non-inverting output in this specific example, the buffer stage is formed of an odd number of buffers. The number of buffer stages and their sizing can be designed depending on the type of output (i.e. inverting or non-inverting) needed, load capacitance and delay.

Here, the buffer stage includes a first buffer 320 coupled to receive the output (Vo1) of the CMOS inverter 310 of the inverter stage, a second buffer 330 coupled to receive the output (Vo2) of the first buffer 320, and a third buffer 340 coupled to receive the output (Vo3) of the second buffer 320 and output a comparator result as an output voltage (Vout). Each buffer 320, 330, 340 can be formed of a PMOS/NMOS pair (M6/M7, M8/M9, M10/M11, not skewed) and configured to drive the load properly.

The first buffer 320 can be designed as a minimum size inverter possible in a technology in order to provide minimum load to the skewed inverter 310. The minimum sizing of the first buffer 320 is beneficial to reduce heavy slewing when Vo1 goes from high to low at high speeds due to the increased pull-down network resistance of the skewed inverter stage implemented by CMOS inverter 310.

Figure 3B:
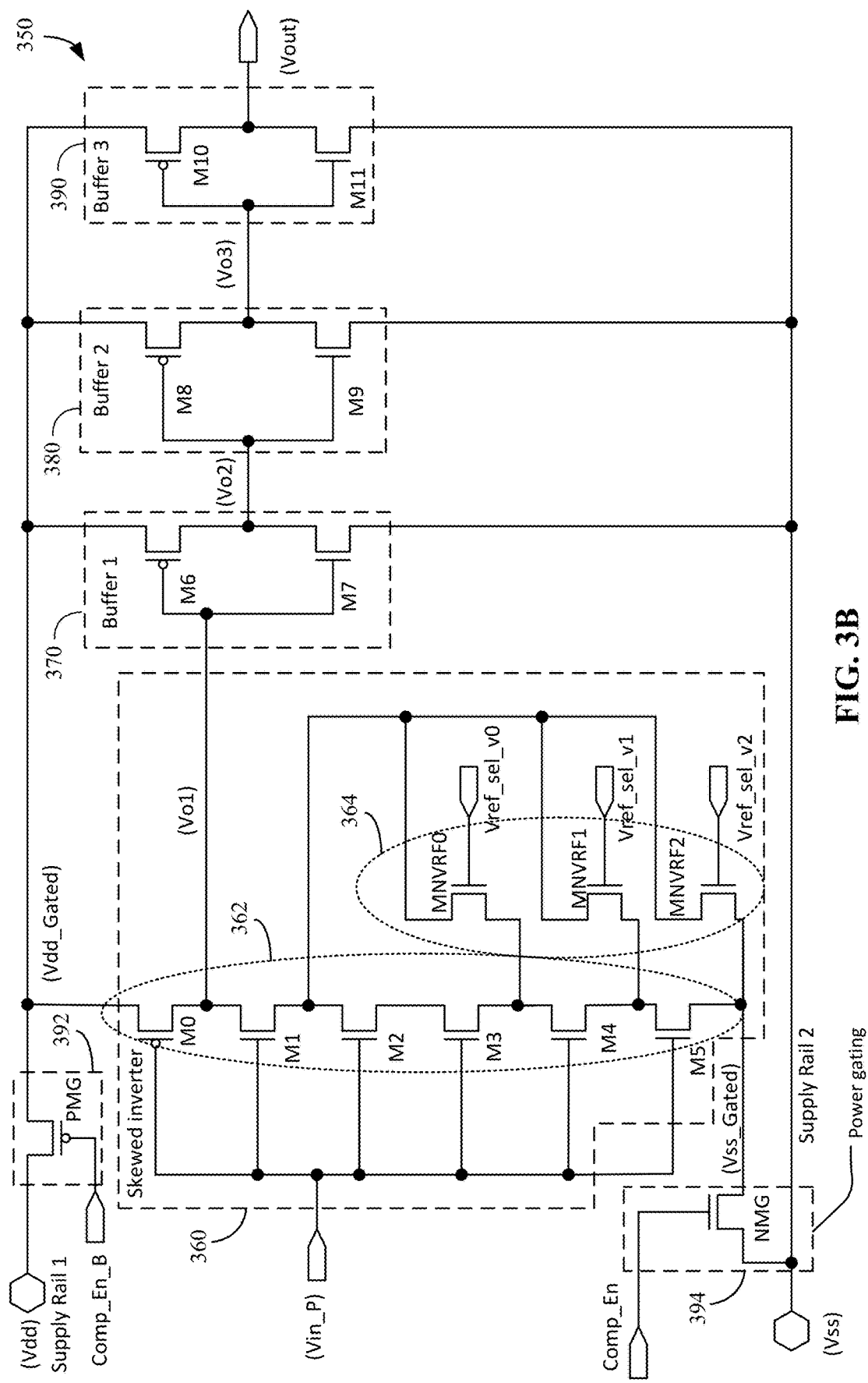
FIG. 3B illustrates an example skewed inverter comparator with programmatic trip voltage and power gating.

FIG. 3B illustrates an example skewed inverter comparator with programmatic trip voltage and power gating. A skewed inverter comparator 350 with programmatic trip voltage includes an inverter stage 360 formed of a CMOS inverter 362 and a programmatic selection circuit of a set of bypass switches 364. The inverter stage 360 is coupled to receive the input voltage (Vin_P) and output a signal (Vo1) to a buffer stage of the skewed inverter comparator 350.

In the illustrated example of FIG. 3B, the set of bypass switches 364 include three bypass transistors MNVRF0, MNVRF1, and MNVRF2, which can respectively be turned ON by the inputs vref_sel_v0, vref_sel_v1, and vref_sel_v2. MOSFETs M1 and M2 can be bypassed by asserting a high on vref_sel_v2; M1, M2, and M3 can be bypassed by asserting a high on vref_sel_v1; and M1, M2, M3, and M4 can be bypassed by asserting a high on vref_sel_v0. Bypassing larger number of NMOSFETs in the pull-down network of the skewed inverter 362 changes the drive strength ratio of the skewed inverter resulting in a variable Vtrip value. This is an example of programmability of Vtrip. It should be understood that in some cases programmatic selection can be applied to a network of PMOS transistors in addition to or as an alternative to the programmatic selection of the NMOS transistors.

As with skewed inverter comparator 300, for skewed inverter comparator 350, to maintain a non-inverting output, the buffer stage can be formed of an odd number of buffers. The number of buffer stages and their sizing can be designed depending on the type of output (i.e. inverting or non-inverting) needed, load capacitance and delay.

Here, the buffer stage includes a first buffer 370 coupled to receive the output (Vo1) of the CMOS inverter 362 of the inverter stage 360, a second buffer 380 coupled to receive the output (Vo2) of the first buffer 370, and a third buffer 390 coupled to receive the output (Vo3) of the second buffer 380 and output a comparator result as an output voltage (Vout). Each buffer 370, 380, 390 can be formed of a PMOS/NMOS pair (M6/M7, M8/M9, M10/M11, not skewed) and configured to drive the load properly. In addition, the first buffer 370 can be designed as a minimum size inverter possible in a technology in order to provide minimum load to the skewed inverter 362. The minimum sizing of the first buffer 370 is beneficial to reduce heavy slewing when Vo1 goes from high to low at high speeds due to the increased pull-down network resistance of the skewed inverter stage implemented by CMOS inverter 362.

In some cases, power gating can be included in a skewed comparator inverter design. Although the optional power gating is shown in the skewed inverter comparator 350, it should be understood that power gating may be omitted from skewed inverter comparator 350. In addition, power gating may also be applied to the skewed inverter comparator 300 of FIG. 3A.

The power gating can be implemented by the addition of power gating transistors (e.g., MOSFETs), PMG 392, which is PMOS and/or NMG 394, which is NMOS. The power gating MOSFETs can be controlled by the complementary digital signals Comp_En_B and Comp_En, respectively. In addition to their function for power gating, which is useful in Low Power applications, these devices can provide additional security for the circuit. For example, with reference to FIG. 1, because the voltage waveform of the voltage on the charge storage device 110 is a function of the activity of the circuit the charge storage device 110 is providing power to, the signature of the circuit activity may be detectable as side channel leakage on a supply current due to the varying displacement current through parasitic capacitive paths. By increasing the parasitic path impedance by more series (parasitic) capacitances, such as by including PMG 392 and NMG 394 in the comparator 130, side channel leakage can be reduced.

While the trip voltage of the CMOS inverter 310 and the available trip voltages of CMOS inverter 362 are set by the ratio of strengths of the pull-up and the pull-down network, the actual sizes of the transistors can be selected based on the delay, frequency of operation, and PVT (process, voltage, and temperature) variation specifications of Vtrip.

For example, with reference to FIG. 1B, in a partial discharge application of the critical capacitor 150, the voltage Vdd_Capi is the input to the comparator 130. When Vdd_Capi is falling during third switch 180 ON phase, Vo1 (in FIG. 3A or 3B) raises. Hence, speeding up this raising Vo1 will help in reducing the delay of the total comparator, thus saving better power in partial discharge operation. For example, this can be achieved by choosing a larger Width of M0, which in turn decides the sizes of all other MOSFETs in the Skewed inverter stage based on the ratio specific to a targeted Vtrip.

Also, the capacitance between each stage's input and output plays a significant role in the overall delay. The Miller effect multiplies the effect of these capacitances and hence can have significant impact and should be considered during circuit and layout design.

Finally, the Vtrip can be set through DC analysis and VTC of the inverters. Actual sizes are set through Transient analysis. An iterative approach of these two analyses is used to design Skewed Inverter Comparator and the "Holistic design" approach (explained earlier) to design the overall partial discharge circuit arrangement.

Figure 4A:
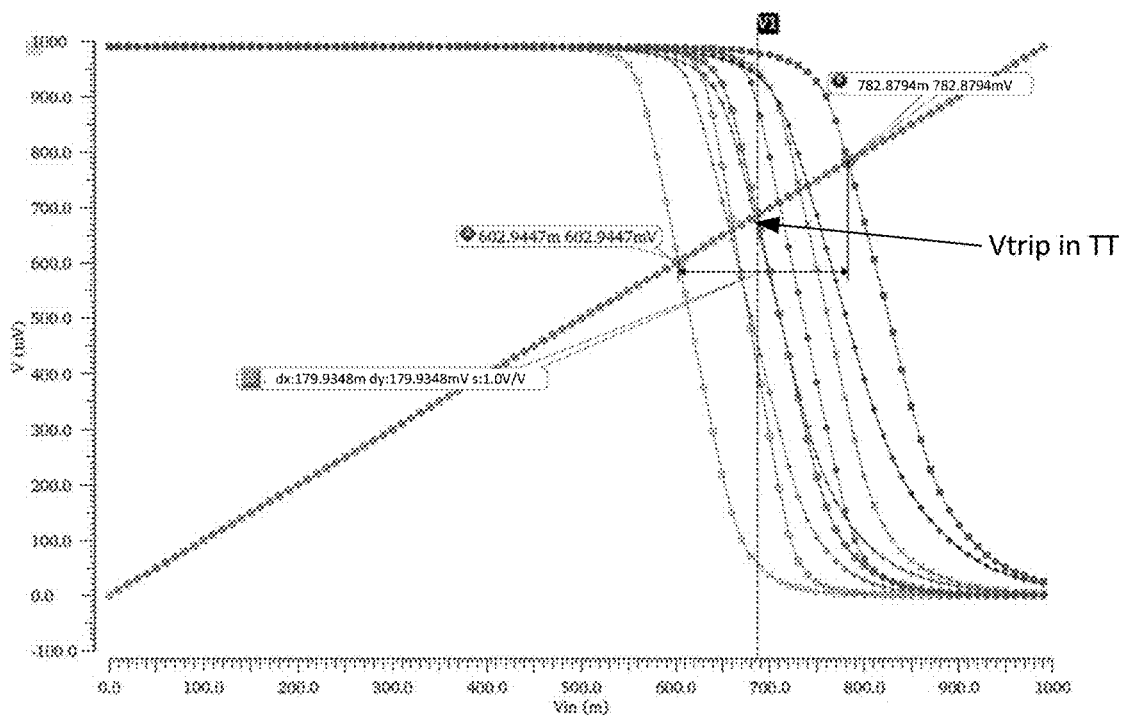
FIGS. 4A and 4B are plots illustrating Voltage Transfer Characteristics (VTC) of an example implementation of a skewed inverter comparator.
Figure 4B:
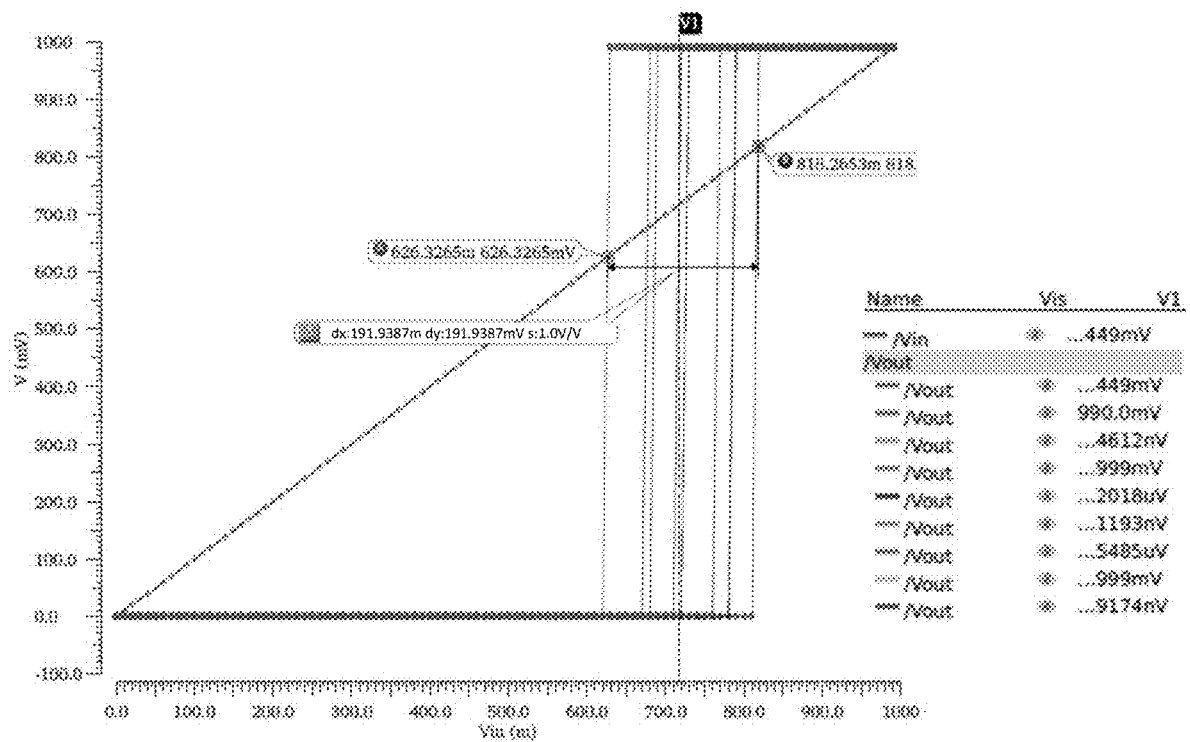

FIGS. 4A and 4B are plots illustrating Voltage Transfer Characteristics (VTC) of an example implementation of a skewed inverter comparator. FIG. 4A shows voltage transfer characteristics of an inverter stage (Vo1 vs. Vin_P) of a skewed inverter comparator such as shown in FIG. 3A; and FIG. 4B shows voltage transfer characteristics of the skewed inverter comparator (Vout vs. Vin_P) such as shown in FIG. 3A.

The plots in FIG. 4A were obtained by sweeping a DC voltage in Vin_P for an example simulation of the skewed inverter comparator of FIG. 3A and observing Vo1. The Vtrip in TT, 0.99V, 25 C (center curve) corner is 686.6125 mV. The Process (SS, SF, FS, FF, TT) and Temperature (−40 C, 25 C, 125 C) dependent variation (at a supply voltage of 0.99V) of Vtrip ranges from ≈603 mV to ≈783 mV as indicated by the two points on the plot.

In FIG. 4B, the response of Vout to Vin_P varying from VSS to VDD is shown. Vtrip of the complete Skewed Inverter Comparator is the point where Vout intersects with Vin_P curve. The Process (SS, SF, FS, FF, TT) and Temperature (−40 C, 25 C, 125 C) dependent variation (at a supply voltage of 0.99V) of Vtrip of the complete Skewed Inverter Comparator ranges from ≈626 mV to ≈818 mV, as indicated by the two points on the plot. All the Vtrip values are much higher than VDD/2 (450 mV). Hence, the name "Skewed Inverter Comparator".

A skewed inverter comparator, such as skewed inverter comparators 300, 350 can be used along with a partial discharge technique in a switched capacitor circuit of a power distribution circuit to provide power savings.

Figure 5A:
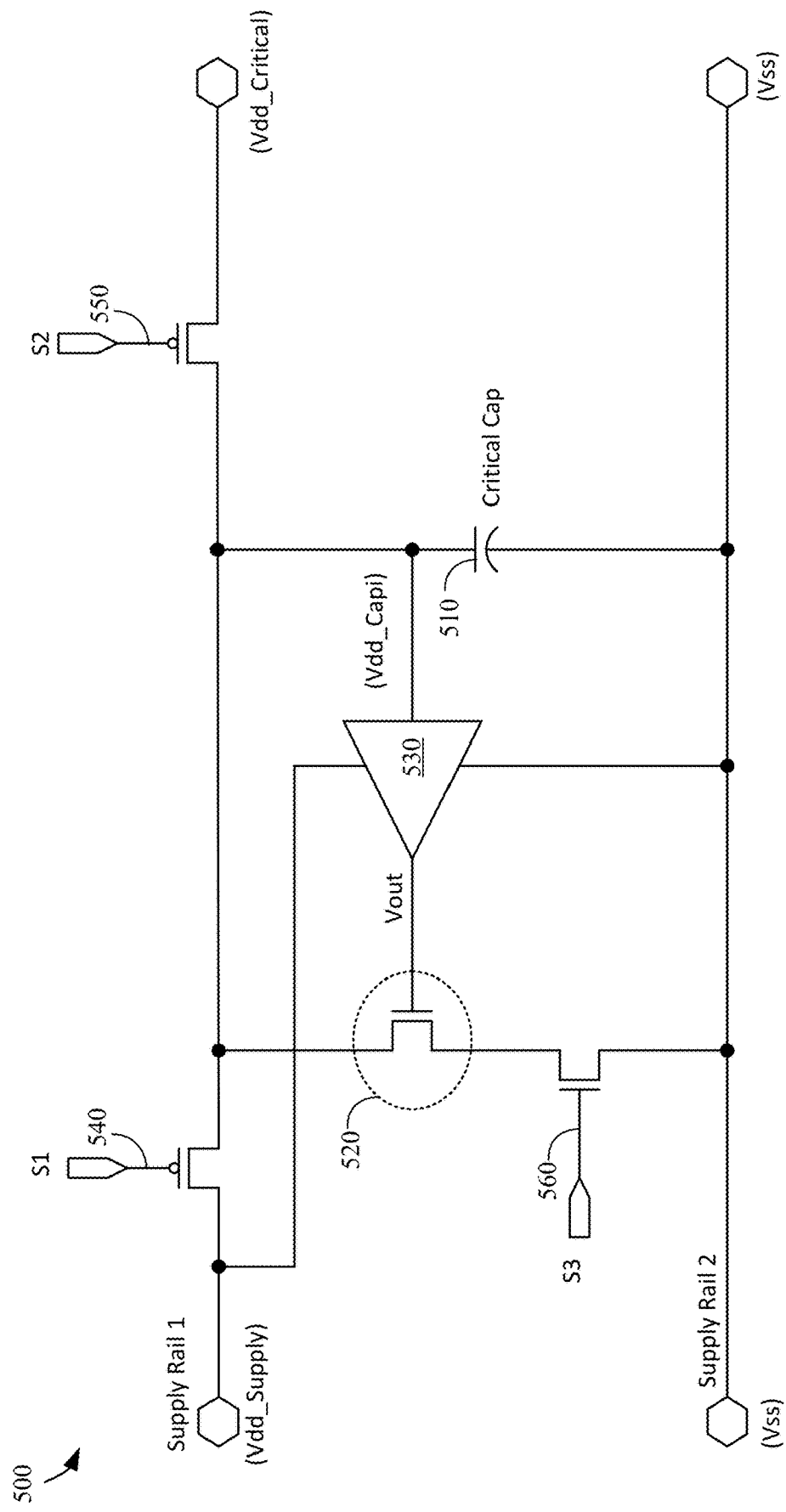
FIG. 5A illustrates a power distribution circuit in which a partial discharge scheme is applied.
Figure 5B:
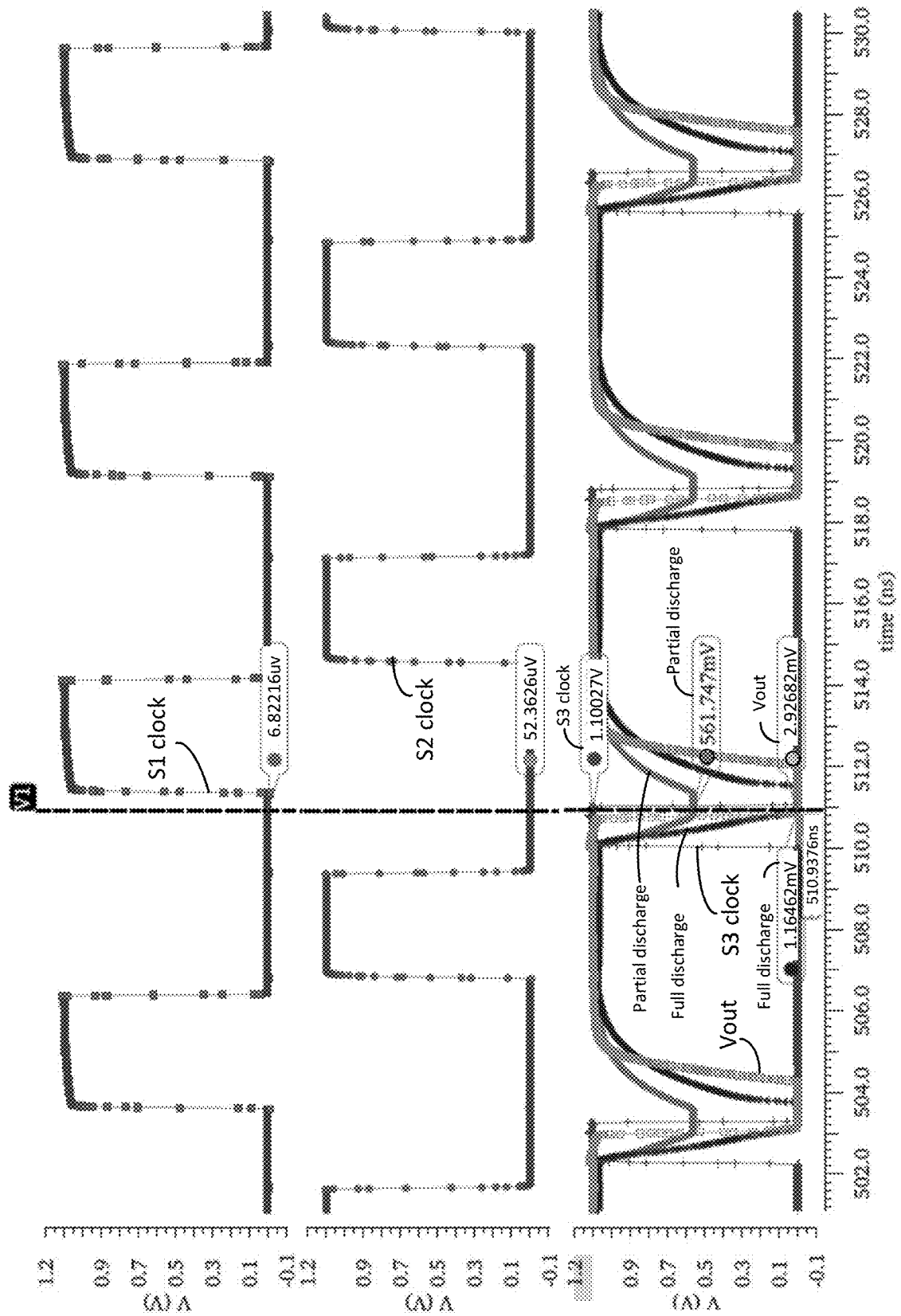
FIG. 5B illustrates a timing diagram and corresponding charge storage capacitor voltages and comparator output waveforms for the power distribution circuit of FIG. 5A using a skewed inverter comparator.

FIG. 5A illustrates a power distribution circuit in which a partial discharge scheme is applied; and FIG. 5B illustrates a timing diagram and corresponding charge storage capacitor voltages and comparator output waveforms for the power distribution circuit of FIG. 5A using a skewed inverter comparator.

Referring to FIG. 5A, a power distribution circuit 500 can be configured according to the switched capacitor circuit of FIG. 1B. In particular, the power distribution circuit 500 includes a critical capacitor 510, a shunt switch 520, a comparator 530, a first switch 540 controlled by S1 clock, a second switch 550 controlled by S2 clock, and a third switch 560 controlled by S3 clock. The comparator 530 can be configured as a skewed inverter comparator, such as described with respect to skewed inverter comparator 300 or skewed inverter comparator 350. The inputs to the comparator 530 shown in FIG. 5A include the first supply rail (Vdd_supply), the second supply rail (Vss), and the critical capacitor voltage (Vdd_Capi). The critical capacitor voltage is input to the Vin_P input shown in FIG. 3A or 3B. An external reference voltage input is not shown since the Vtrip of the comparator 530 functions as the reference voltage.

Referring to FIG. 5B, S1 clock and S2 clock are independently shown, and the S3 clock is shown with the output of Skewed Inverter Comparator (Vout) and Vdd_Capi waveform (for partial discharge and for full discharge for one of the PVT corners) in time domain. As can be seen, the S3 clock has a much smaller pulse width than the S1 clock and the S2 clock. During this pulse duration, it is desirable for the total comparator reaction (e.g., of comparator 530) and shunt switch (e.g., of switch 520) reactions to occur. That means the delay of the comparator and the whole switch network all added together should be less than the time period of this pulse, which is very difficult to achieve with the usual analog comparator because to get an analog comparator to function that fast, it will consume a significant amount of current (and thus power). Advantageously, the partial discharge Vdd_Capi value for the partial discharge scheme for the described skewed inverter comparator does not fall below 561.72 mV (with Vdd_Supply=1.1V) during S3 turn-on phase. Of course, as also seen by the full discharge Vdd_Capi value falling to 1.16462 mV (≈0V), it is possible for the full discharge scheme to work within the duration of the S3 clock; however, as mentioned above, such a scheme consumes more power. The switching off of the shunt switch 520 is done by the Skewed Inverter Comparator's output signal (Vout), which prevents any further discharge of the Critical Cap, thus reducing power consumption. It should be understood that this is an example of the circuit operation, and the particular values can change depending on technology, PVT corners and specifications.

As mentioned above, by using a CMOS inverter as part of the comparator circuit, it is possible to introduce less delay (as compared to existing analog comparator circuits), lower power consumption (since there is no DC biasing), and the variation of Vtrip is directly proportional to the supply voltage of the inverter (e.g., as the VDD supply increases, which increases the output voltage, Vref is able to increase as well since Vtrip increases along with VDD supply). It should be noted that Vtrip will vary by large values across process and temperature, which necessitates a designer to ensure that Vtrip is not equal to or larger than Vdd_Critical (the output voltage of the switched capacitor circuit) across all PVT corners and operating conditions during the design phase to ensure effective protection from Side Channel Attacks (and recognizing that this may result in a trade-off with respect to power savings). Using MOSFETS with characteristics that vary less with respect to process, voltage, and temperature variation (e.g., MOSFETs for analog applications) in a fabrication technology can also reduce Vtrip variation.

In another implementation of inverter stage 210, the reference voltage is set by a reference circuit or by simple resistive or capacitive voltage dividers. Inverter stage 210 can thus be formed of two stages: a reference voltage stage and an input stage. The reference voltage stage is configured to achieve (process and temperature) variation tolerance and also to set the Vtrip of the input stage equal to Vref (i.e., the input voltage to the reference voltage stage, for example, to achieve a value greater than VDD/2) This implementation can be referred to as a variation tolerant inverter comparator. In yet another implementation of inverter stage 210, both a reference voltage stage and an input stage forming the inverter stage 210 are configured using common transistors to achieve process and temperature variation tolerance. This implementation can also be referred to as a variation tolerant inverter comparator. Both implementations are process and temperature variation tolerant.

For the variation tolerant inverter comparator, the reference voltage can be set by applying the desired voltage at the Vref terminal input to the reference voltage stage. In some cases, Vref can be set by reference circuit such as a Bandgap voltage reference circuit or by resistive (or capacitive) voltage dividers, depending on the application and implementation (see e.g., FIG. 8B for an example of a resistive voltage divider). Similar to the skew inverter comparator, the variation tolerant inverter comparator uses the properties of a digital inverter to its advantage. For example, there is less delay and power consumption as compared to an analog comparator since there is no DC biasing current.

Figure 6A:
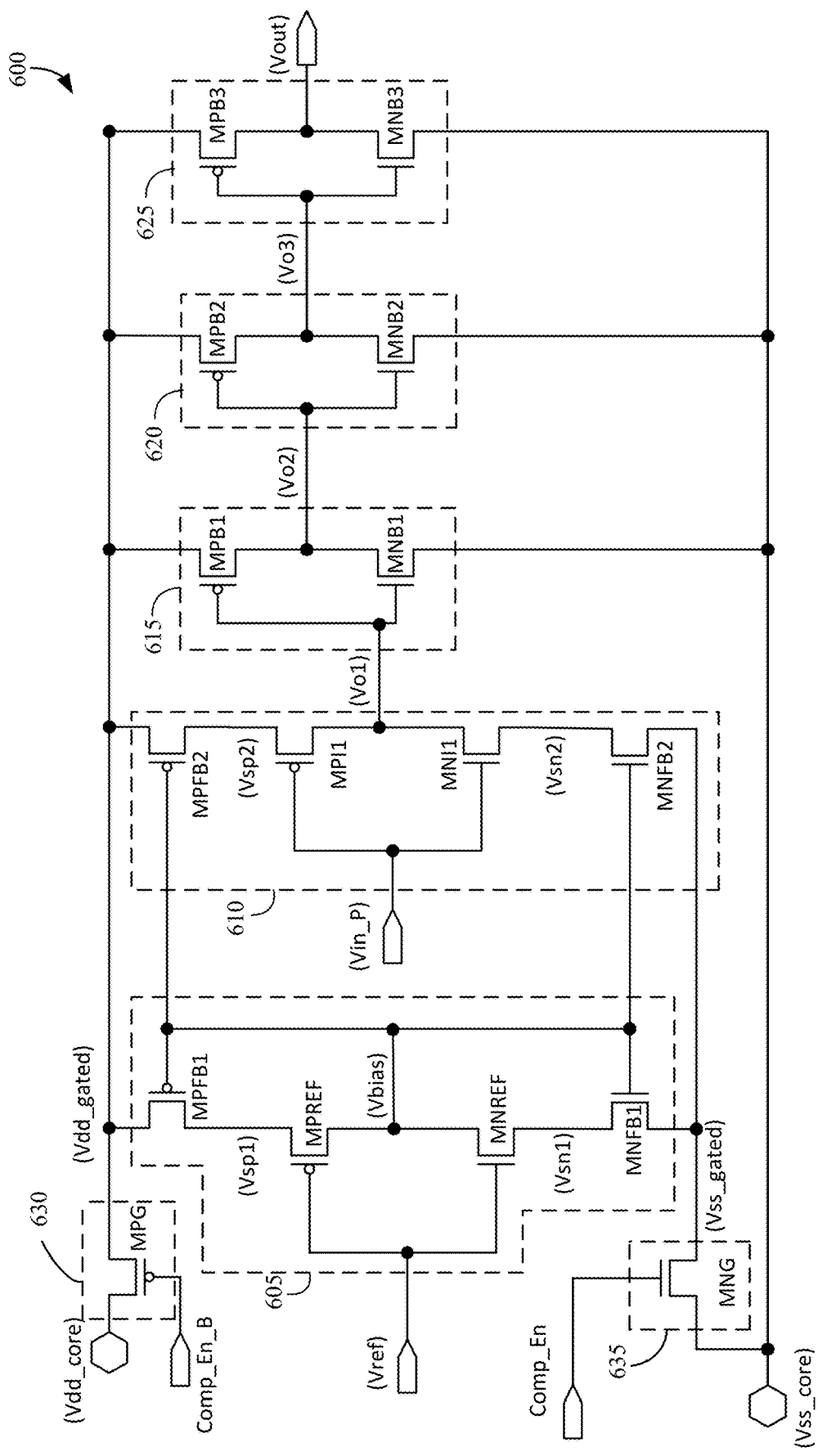
FIG. 6A illustrates an example variation tolerant inverter comparator and optional power gating.
Figure 6B:
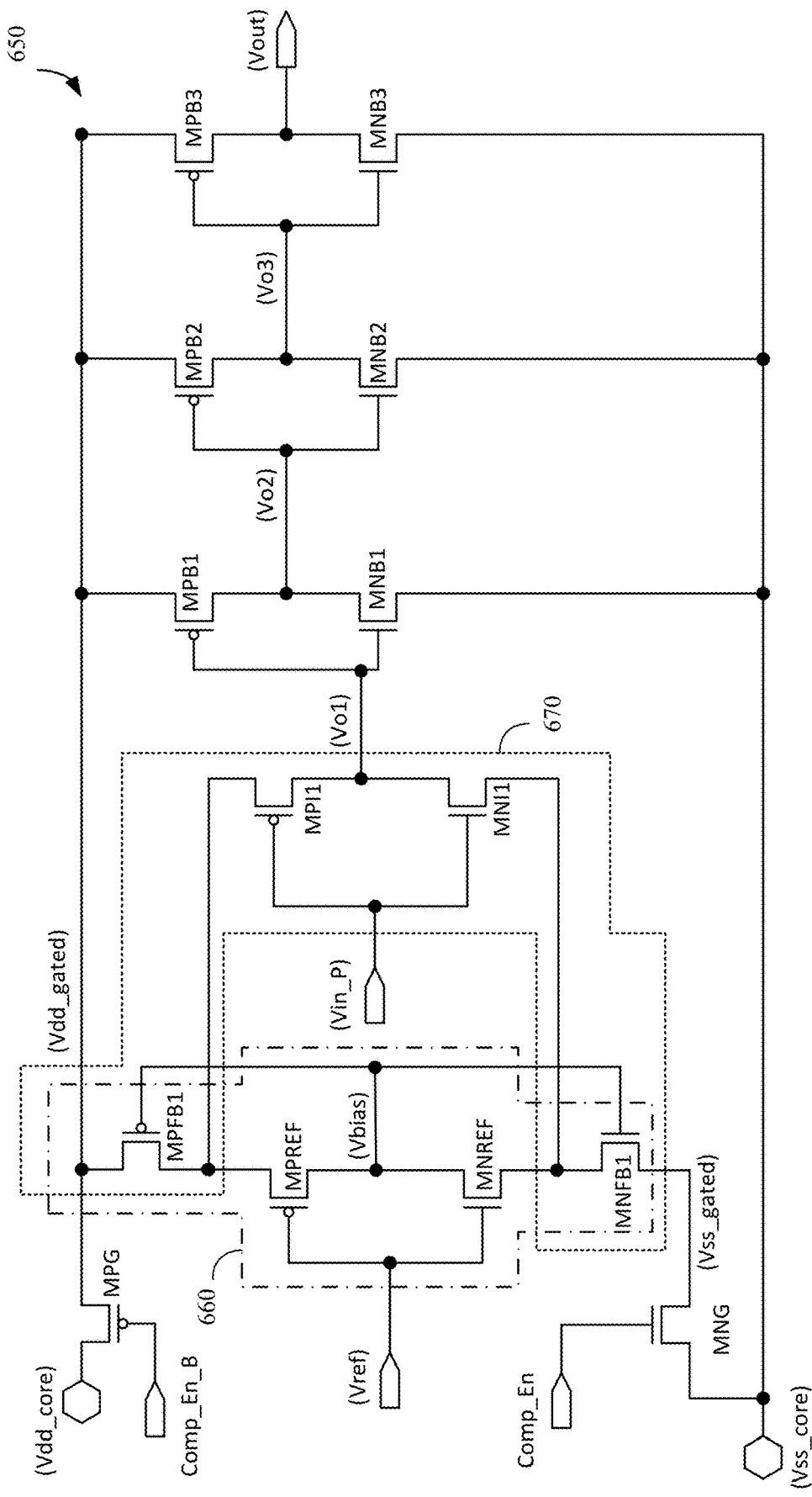
FIG. 6B illustrates an example variation tolerant inverter comparator with common variation compensation devices for both the reference voltage stage and the input stage.

FIG. 6A illustrates an example variation tolerant inverter comparator and optional power gating; and FIG. 6B illustrates an example variation tolerant inverter comparator with common variation compensation devices for both the reference voltage stage and the input stage.

Referring to FIG. 6A, a variation tolerant inverter comparator 600 includes an inverter stage formed of a reference voltage stage 605 and an input stage 610; and a buffer stage coupled to an output of the inverter stage.

The buffer stage can be formed of an odd number of buffers. The number of buffer stages and their sizing can be designed depending on the type of output (i.e. inverting or non-inverting) needed, load capacitance and delay. Here, the buffer stage includes a first buffer 615 coupled to receive the output (Vo1) of the input stage 610, a second buffer 620 coupled to receive the output (Vo2) of the first buffer 615, and a third buffer 625 coupled to receive the output (Vo3) of the second buffer 620 and output a comparator result as an output voltage (Vout). Each buffer 615, 620, 625 can be formed of a PMOS/NMOS pair (MPB1/MNB1, MPB2/MNB2, MPB3/MNB3, not skewed) and configured to drive the load properly.

The reference voltage stage 605 includes a CMOS inverter with transistor pair MPREF and MNREF whose input (at Vref) acts as a reference voltage for the variation tolerant inverter comparator 600; and the input stage 610 includes a CMOS inverter with transistor pair MPI1 and MNI2 that is matched (as replicas and in layout) to the transistor pair MPREF and MNREF of the reference voltage stage 605. The input to the input stage 610 is the input of the comparator (Vin_P).

Because of process variation and temperature, the transistors of the two CMOS inverters may have dissimilar strengths. To compensate for the variation, the reference voltage stage 605 further includes a pull-up compensation transistor MPFB1 and a pull-down compensation transistor MNFB1; and the input stage 610 further includes a pull-up compensation transistor MPFB2 and a pull-down compensation transistor MNFB2.

The compensation transistors MPFB1 and MNFB1 are coupled to the CMOS inverter of the reference voltage stage 605 to form two negative feedback loops, which contribute to the process and temperature variation tolerance of the comparator 600. The loop with MPFB1, MPREF and output node with bias voltage (Vbias) forms the loop to control the pull-up network. The loop with MNFB1, MNREF and the output node with Vbias forms the loop to control the pull-down network.

The CMOS inverter of the input stage 610 is made to skew such that Vtrip>VDD/2 through Vbias, which is the output of the reference voltage stage 605. That is, the trip point voltage (Vtrip) of the input stage 610 equals (with small practical variations) to the voltage applied to the Vref terminal of the reference voltage stage.

As previously described, Vtrip of an inverter is controlled by the strengths of the pull-up network and the pull-down network. Hence, for a Vtrip>VDD/2, the pull-up network in the input stage 610 (with MPFB2 and MPI1) should provide higher drive strength (lesser resistance) than the pull-down network of that stage due to MNI1 and MNFB2. The control of strength of the pull-up network and the pull-down network is through the voltage Vbias. Vbias is not a digital (binary) signal but can take a continuous value. The value of Vbias is a function of Vref, process, and temperature. Vbias has two roles whose combined effect decides the value of Vbias. First, to set the Vtrip of input stage 610 equal to Vref. Second, to compensate the variations due to process and temperature variations.

Regarding the first point that Vref controls Vbias to set the Vtrip of the input stage 610, if Vref>VDD/2, then MNREF in the pull-down network has better drive strength than MPREF in the pull-up network. Thus, making Vbias<VDD/2. If Vref<VDD/2, then MPREF in the pull-up network has better drive strength than MNREF in the pull-down network, and Vbias≥VDD/2. When Vref=VDD/2, both MNREF and MPREF have the same drive strengths, and Vbias is about VDD/2. Vref closer or equal to the rails (e.g., VDD or VSS) will turn off the MOSFETs and the circuit will become dysfunctional. Therefore, the Vref value should be well within the range of (VDD−Vtp) and Vtn, where Vtp and Vtn are threshold voltages of PMOS and NMOS FETs, respectively. Hence, choosing MOSFETs with lesser value of threshold voltages helps in a larger Vref range at the cost of higher current consumption.

The devices MPFB1 and MNFB1 do not allow the Vbias to vary from rail-to-rail supply voltage (like a digital signal). As mentioned above, MPFB1 and MNFB1 are part of the negative feedback loops, which keep the Vbias within certain range about VDD/2. Reduction in Vbias reduces the strength of the pull-down network (resistance offered by MNREF and MNFB1) by controlling the gate to source voltage (Vgs) of MNFB1 and increases the strength of the pull-up network (resistance offered by MPFB1 and MPREF) by controlling the Vgs of MPFB1. The increase in the pull-up network drive in turn pulls up the Vbias by small value; hence, decreasing the drive strength of the pull-up network back to the steady level (and negative feedback). However, the value of Vbias is a major function of Vref and only gets affected by the negative feedback by lesser extent. Increase in Vbias results in vice-versa control of the pull-up network and the pull-down network. Hence, the feedback loop ensures that Vbias does not go either to VDD or to VSS.

This feedback control results in a steady state of Vbias for a given Vref. The steady state is reached once the pull-up network and the pull-down network of Vref stage equals in drive strength via feedback operation.

Turning to the second point of compensating for impact of process and temperature variations, it is known that the On resistance (Rds) of a MOSFET varies with process and temperature. This means that the drive strength of the pull-up network and the pull-down network also varies with process and temperature. The negative feedback loops in the reference voltage stage 605 compensate for this process and temperature-based drive strength variation of Vtrip. As explained in more detail below, Vbias is a major function of Vref since the pull-up network and the pull-down network strengths depend on the Rds of MPREF and MNREF respectively. Any change in these strengths due to process and/or temperature variation, results in change of Vbias and activation of the negative feedback loop; and the negative feedback loop compensates this change in Vbias. Thus, Vbias becomes purely (or to a large extent) only the function of Vref.

Effectively, Vbias is inversely proportional to Vref. Thus, a Vref>VDD/2, leads to Vbias≤VDD/2. A smaller Vbias makes the pull-down network of the input stage 610 weaker and the pull-up network of the input stage 610 stronger. This tilt in the drive strengths of the pull-up network and the pull-down network of the input stage 610 alters its Vtrip from being VDD/2. Since, the input stage 610 is the replica of reference voltage stage 605, the drive strengths of MPFB1 equals MPFB2 and MNFB1 equals MNFB2. However, MPFB2 is stronger than MNFB2. Hence, to bring the state of Vo1 from High to Low, more gate overdrive is needed in MNI1. A larger Vin_P value provides this extra over drive to MNI1 and equally reduces the gate overdrive of MPI1. This value of Vin_P where the Vo1 switches its state (or Vo1 equals Vin_P) becomes the Vtrip of the input stage 610. By virtue of replica design and matching of reference voltage stage 605 and input stage 610, Vtrip equals to Vref (only with smaller variations).

Turning now to FIG. 6B, the variation tolerant inverter comparator 650 can be almost the same design as the variation tolerant inverter comparator 600 of FIG. 6A, but with MPFB2 and MNFB2 removed and MPFB1 and MNFB1 widths doubled. That is, compensation devices are MPFB1 and MNFB1 are shared by both the reference voltage stage 660 and the input stage 670. Just as described with respect to the reference voltage stage 605 and the input stage 610, for the variation tolerant inverter comparator 650, MPREF & MPI1 and MNREF & MNI1 are replica and matched pairs.

Power gating can be included in a variation tolerant inverter comparator. Although the optional power gating is shown in the variation tolerant inverter comparators 600, 650, it should be understood that power gating may be omitted. As previously described with respect to FIG. 3B, the power gating can be implemented by the addition of power gating MOSFETs, MPG, which is a PMOS power gating MOSFET 630, and MNG, which is an NMOS power gating MOSFET 635. The power gating MOSFETs can be controlled by the complementary digital signals Comp_En_B and Comp_En, respectively. In addition to their function for power gating, which is useful in Low Power applications, these devices can provide additional security for the circuit (e.g., to reduce side channel leakage).

Due to the presence of negative feedback loop in the circuit topology, the circuit is agnostic to the type of transistors used to a larger extent. Using components with lesser characteristics variation with PVT are preferred as in any other circuits. The sizing of inverters (MPREF & MNREF, MPI1 & MNI1) are designed by first keeping Vref=VDD/2. At this Vref, the Vtrip of the input stage 610 is expected to be equal to Vref. The sizing of the inverters is selected to ensure this. Any dissimilar drive strength occurring due to improper sizing of inverters results in larger offset of comparator. The negative feedback loop may not fully compensate for this drive strength difference. The widths of the MOSFETs are chosen depending on the frequency of operation. Higher speeds use larger widths (hence smaller RC time constants) and vice-versa. This decides both area and power consumed by this comparator. The reference voltage stage 605 does consume some static current due to its analog nature (due to Vbias not reaching VDD or VSS to completely turn-off either the pull-down network or the pull-up network respectively). However, the current consumed by the input stage 610 depends on the input signal (Vin_P). The overall current consumption is smaller than a conventional analog comparator for a given specification. The sizes of MPFB1, MPFB2, MNFB1, MNFB2 can be made larger if needed as they do not do any high frequency operations. The sizes of power gating devices MPG and MNG are sized to minimize the voltage drop across them during normal operation of the comparator. The buffer stage is designed to achieve less overall delay of the comparator. Also, the capacitance between each stage's input and output plays a significant role in the overall delay. The Miller effect multiplies the effect of these capacitances and hence can have significant impact. Accordingly, the circuit and layout design should take these capacitances into account. The overall partial discharge circuit arrangement can be designed by taking the "Holistic design" approach explained earlier.

Figure 7A:
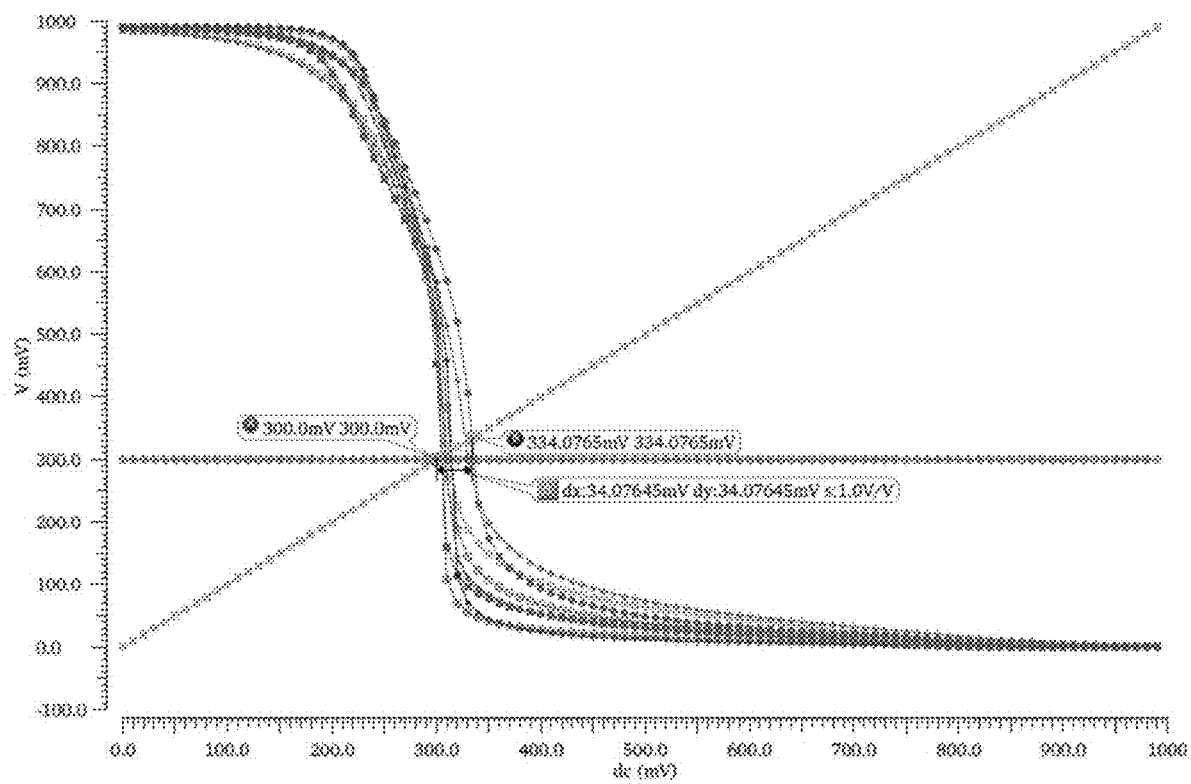
FIGS. 7A-7I are plots illustrating electrical characteristics of an example implementation of a variation tolerant inverter comparator.
Figure 7B:
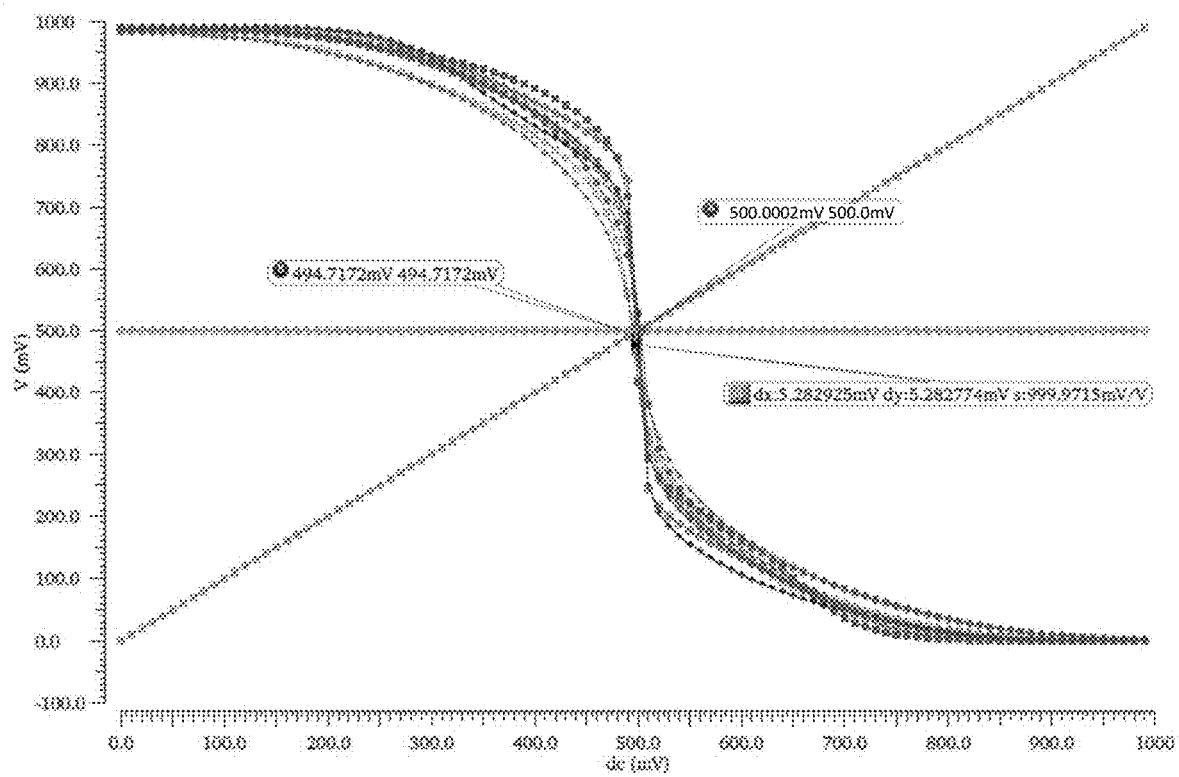
Figure 7C:
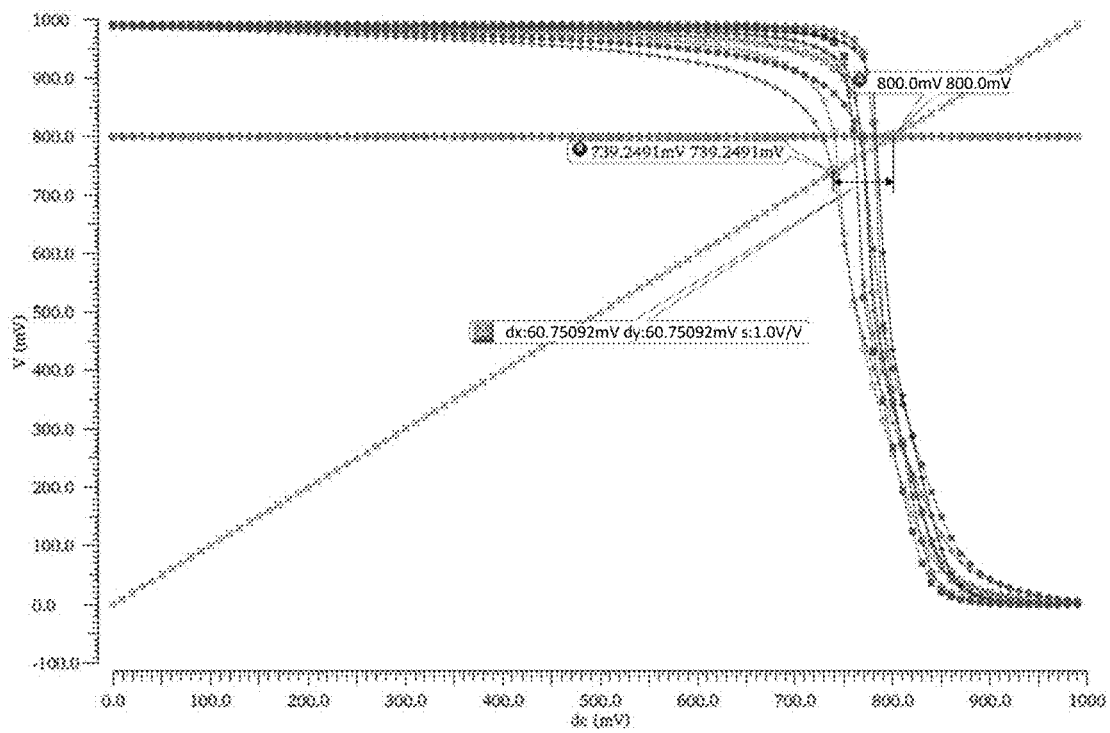
Figure 7D:
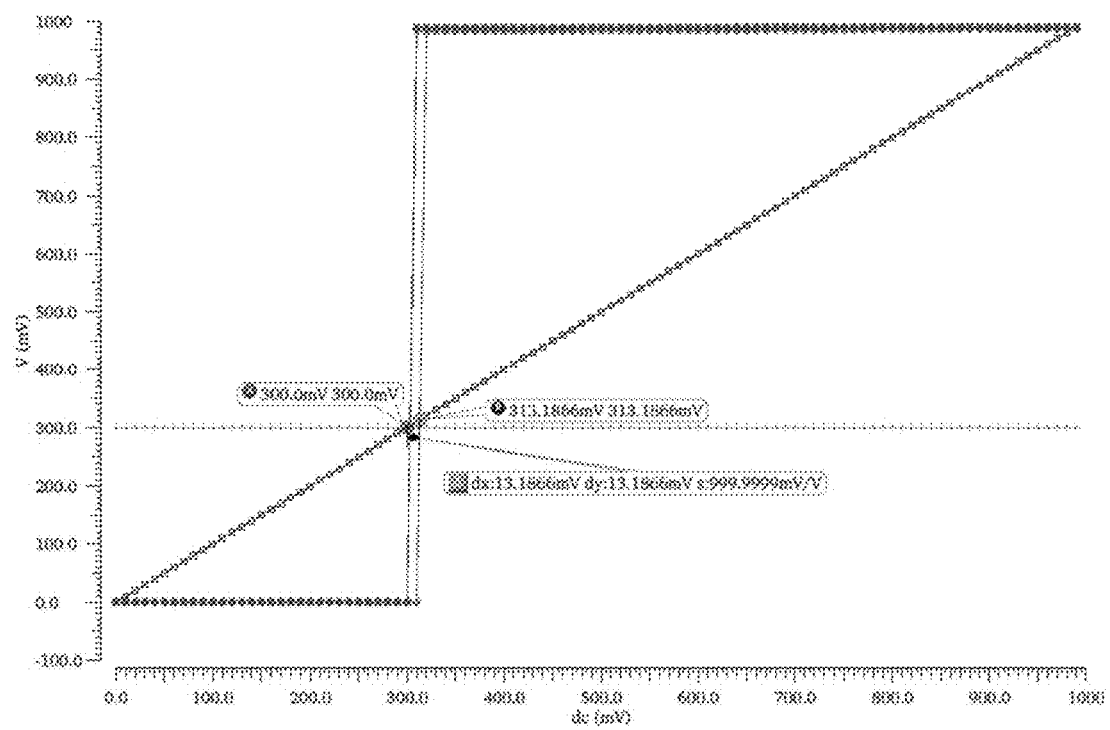
Figure 7E:
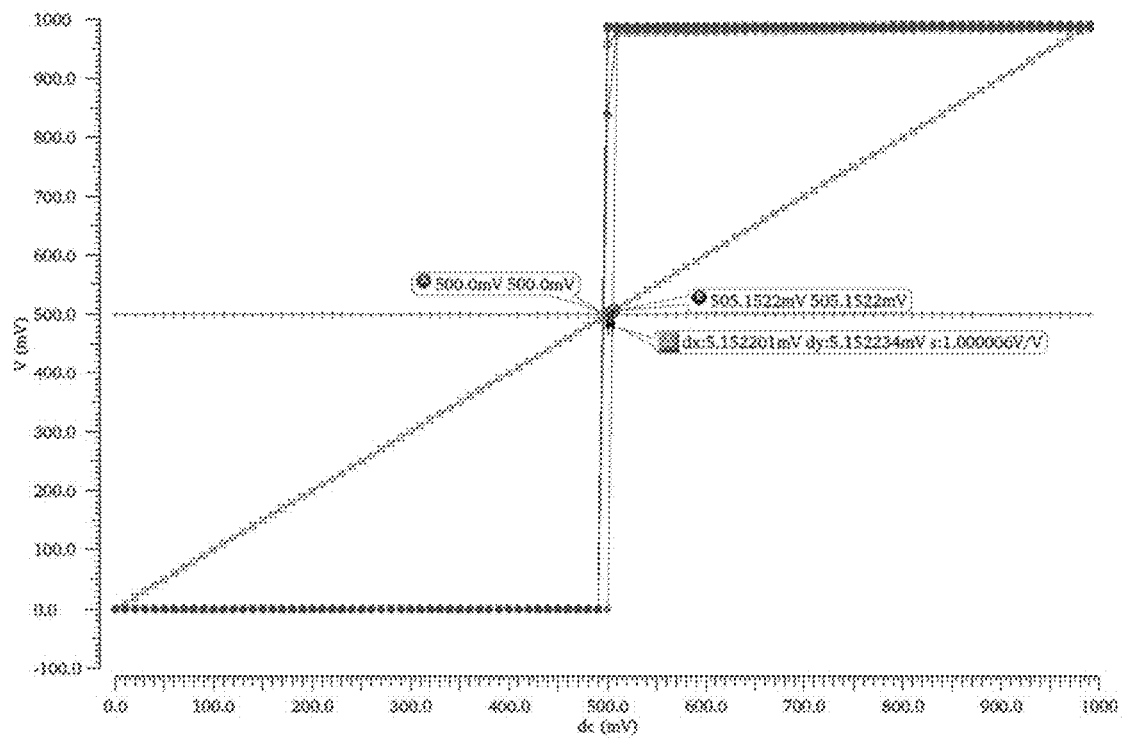
Figure 7F:
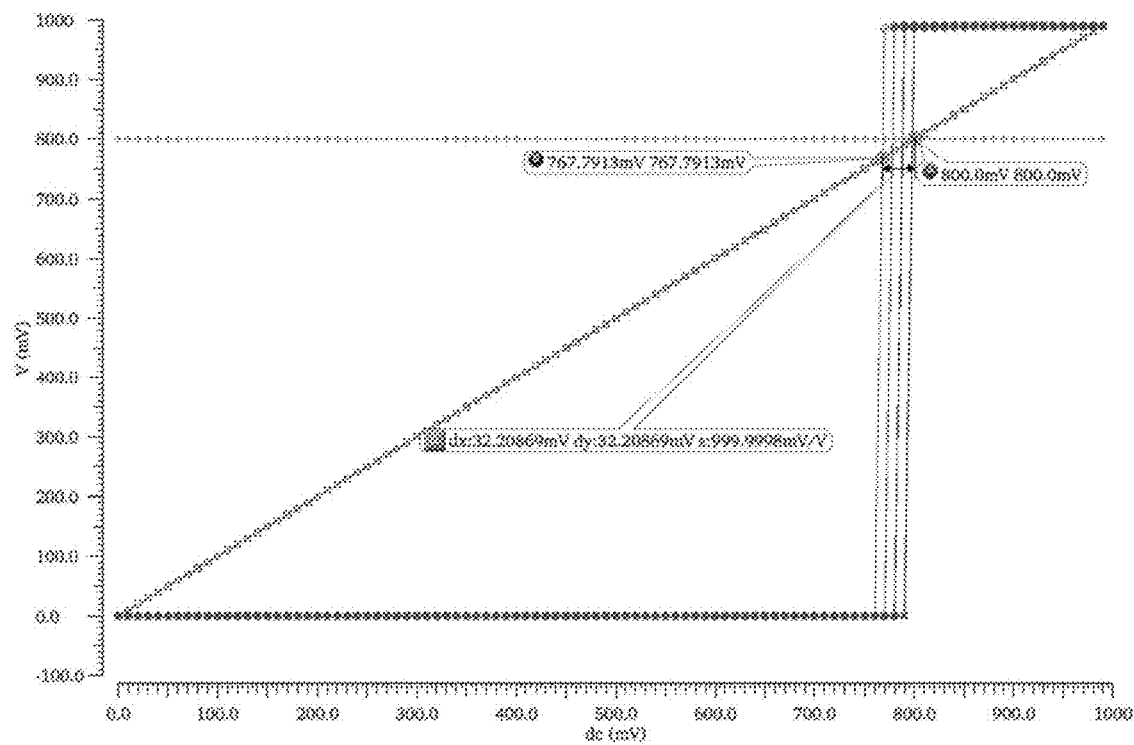

FIGS. 7A-7I are plots illustrating electrical characteristics of an example implementation of a variation tolerant inverter comparator. FIGS. 7A-7F show the VTC of Vo1 (e.g., FIGS. 7A-7C) and Vout (e.g., FIGS. 7D-7F) across Process (SS, FF, SF, FS, TT) and Temperature (−40 C, 25 C, 125 C) at a supply voltage of 0.99V. In particular, FIG. 7A shows VTC (Vo1 vs. Vin_P) of the variation tolerant inverter comparator 600 such as shown in FIG. 6A with Vref=300 mV, where the maximum offset is ≈34 mV; FIG. 7B shows VTC (Vo1 vs. Vin_P) of the variation tolerant inverter comparator 600 such as shown in FIG. 6A with Vref=500 mV, where the maximum offset is ≈5.5 mV; FIG. 7C shows VTC (Vo1 vs. Vin_P) of the variation tolerant inverter comparator 600 such as shown in FIG. 6A with Vref=800 mV, where the maximum offset is ≈61 mV; FIG. 7D shows VTC (Vout vs. Vin_P) of the variation tolerant inverter comparator 600 such as shown in FIG. 6A with Vref=300 mV, where the maximum offset is ≈13 mV; FIG. 7E shows VTC (Vout vs. Vin_P) of the variation tolerant inverter comparator 600 such as shown in FIG. 6A with Vref=500 mV, where the maximum offset is ≈5 mV; and FIG. 7F shows VTC (Vout vs. Vin_P) of the variation tolerant inverter comparator 600 such as shown in FIG. 6A with Vref=800 mV, where the maximum offset is ≈32.5 mV.

It can be observed that the maximum offsets are much less than the Vtrip variation of the skewed inverter comparator. Also, the Vtrip in the variation tolerant inverter comparator is closer to the set Vref (as opposed to Vdd/2 in a conventional inverter). Hence, this circuit can work as a comparator.

Figure 7G:
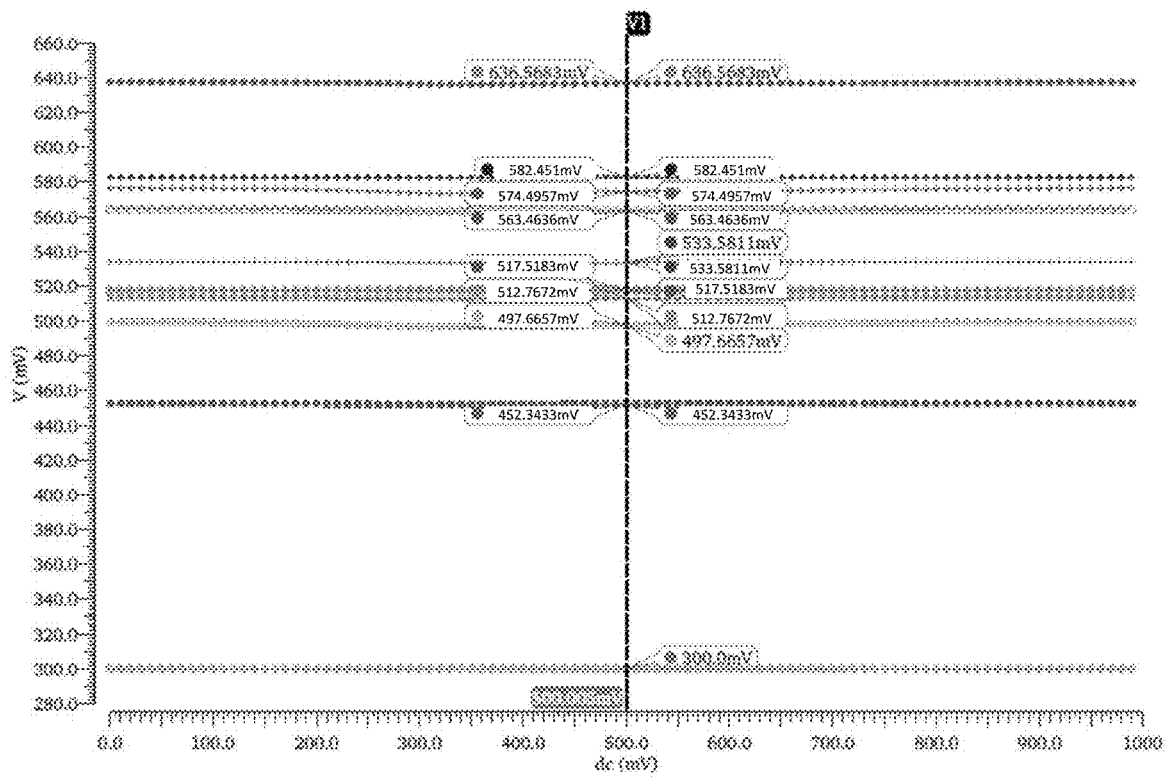
Figure 7H:
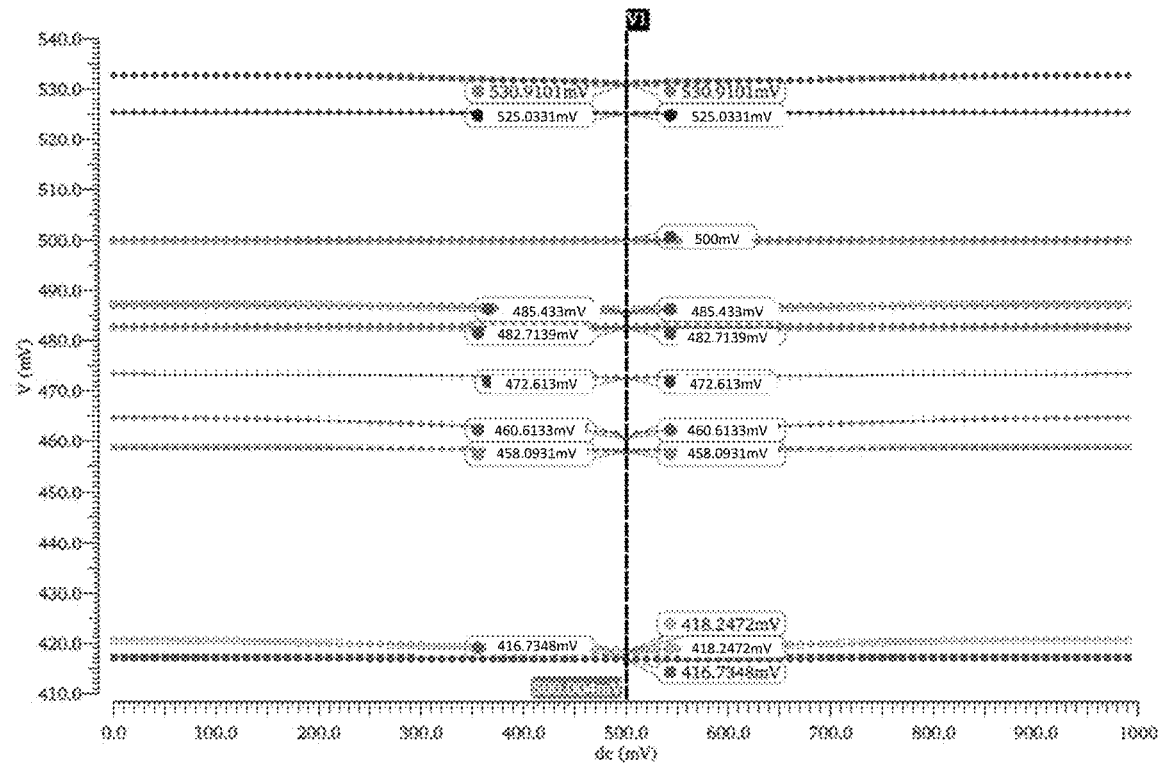
Figure 7I:
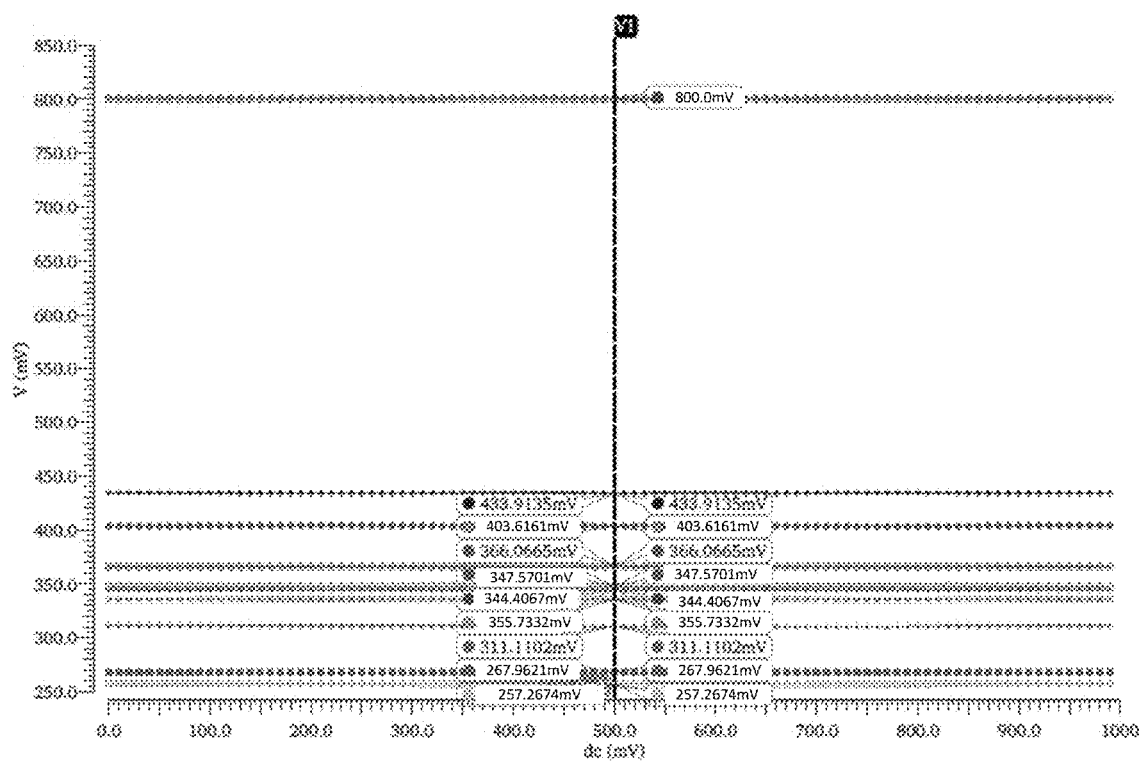

FIGS. 7G-7I show Vbias across different Vref, Process (SS, FF, SF, FS, TT) and Temperature (−40 C, 25 C, 125 C) at a supply voltage of 0.99V. The Vbias profiles in FIGS.

7G-7I correlates to the combined effects of setting the Vtrip of Input stage equal to Vref and compensating for the variations due to Process and Temperature variations. In particular, FIG. 7G shows Vbias vs. Vin_P of the variation tolerant inverter comparator 600 such as shown in FIG. 6A with Vref=300 mV; FIG. 7H shows Vbias vs. Vin_P of the variation tolerant inverter comparator 600 such as shown in FIG. 6A with Vref=500 mV; and FIG. 7I shows Vbias vs. Vin_P of the variation tolerant inverter comparator 600 such as shown in FIG. 6A with Vref=800 mV.

Figure 8A:
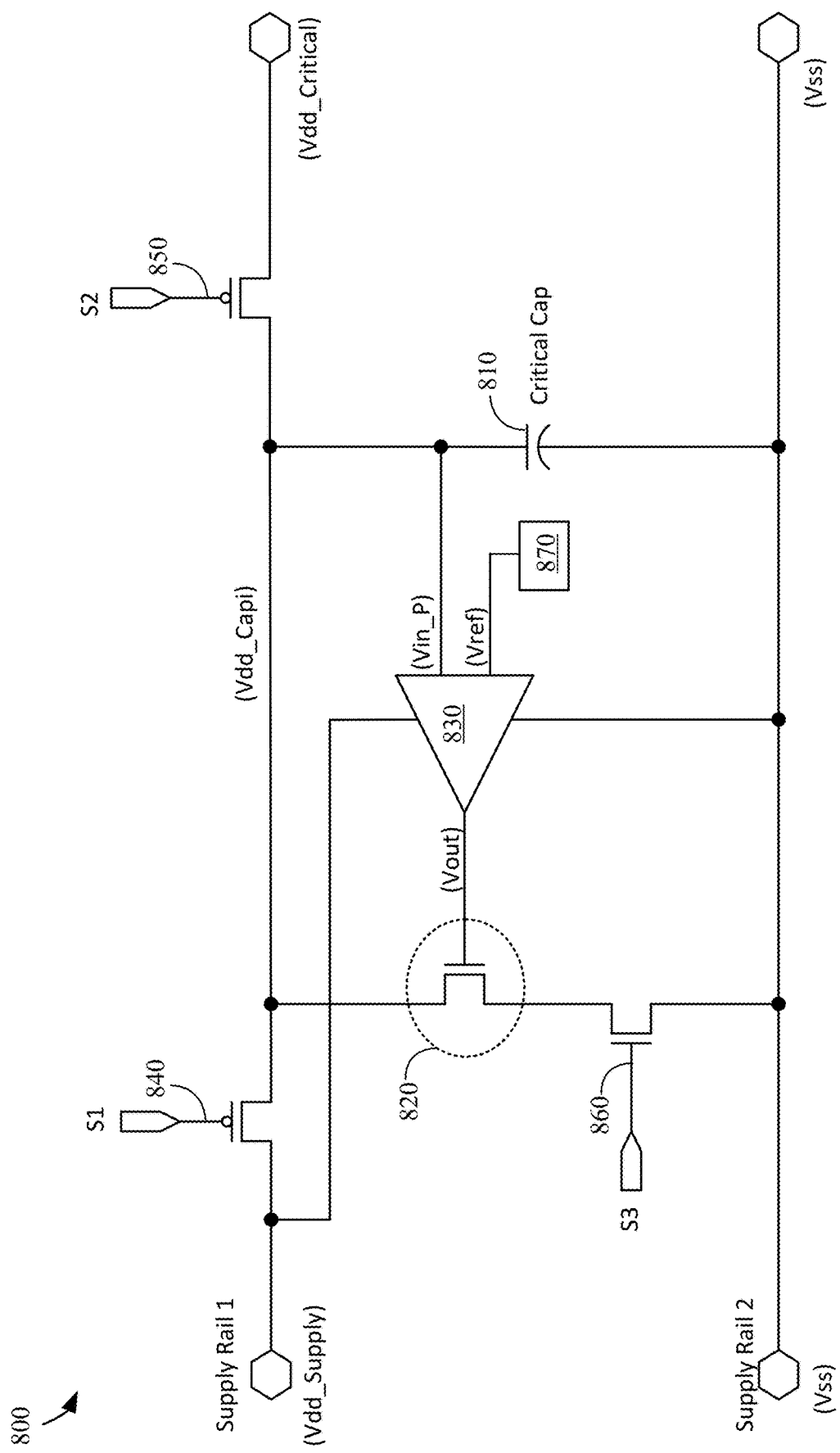
FIG. 8A illustrates a power distribution circuit in which a partial discharge scheme is applied.
Figure 8B:
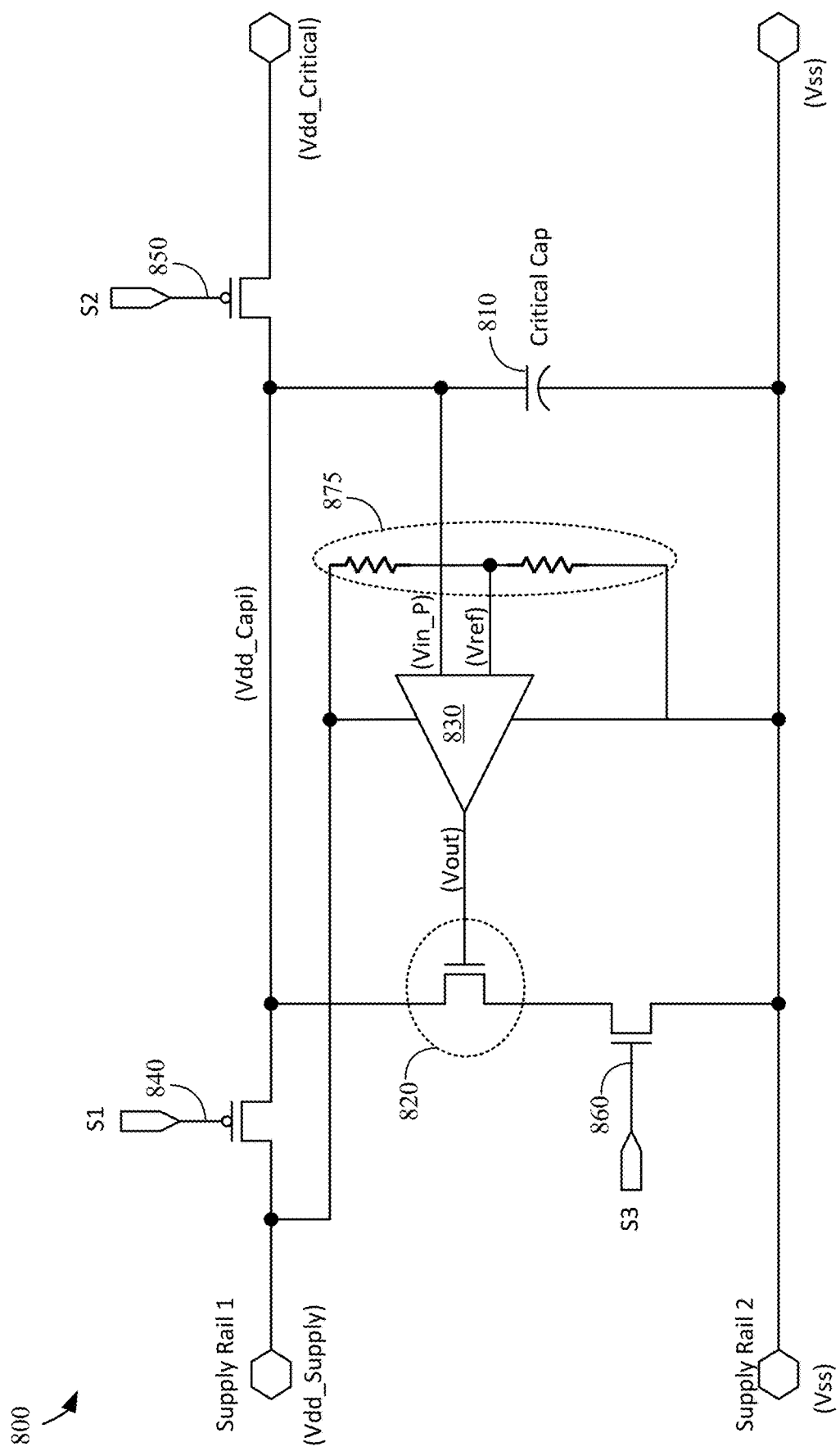
FIG. 8B illustrates an implementation of the power distribution circuit of FIG. 8A using a voltage divider for the reference voltage.
Figure 8C:
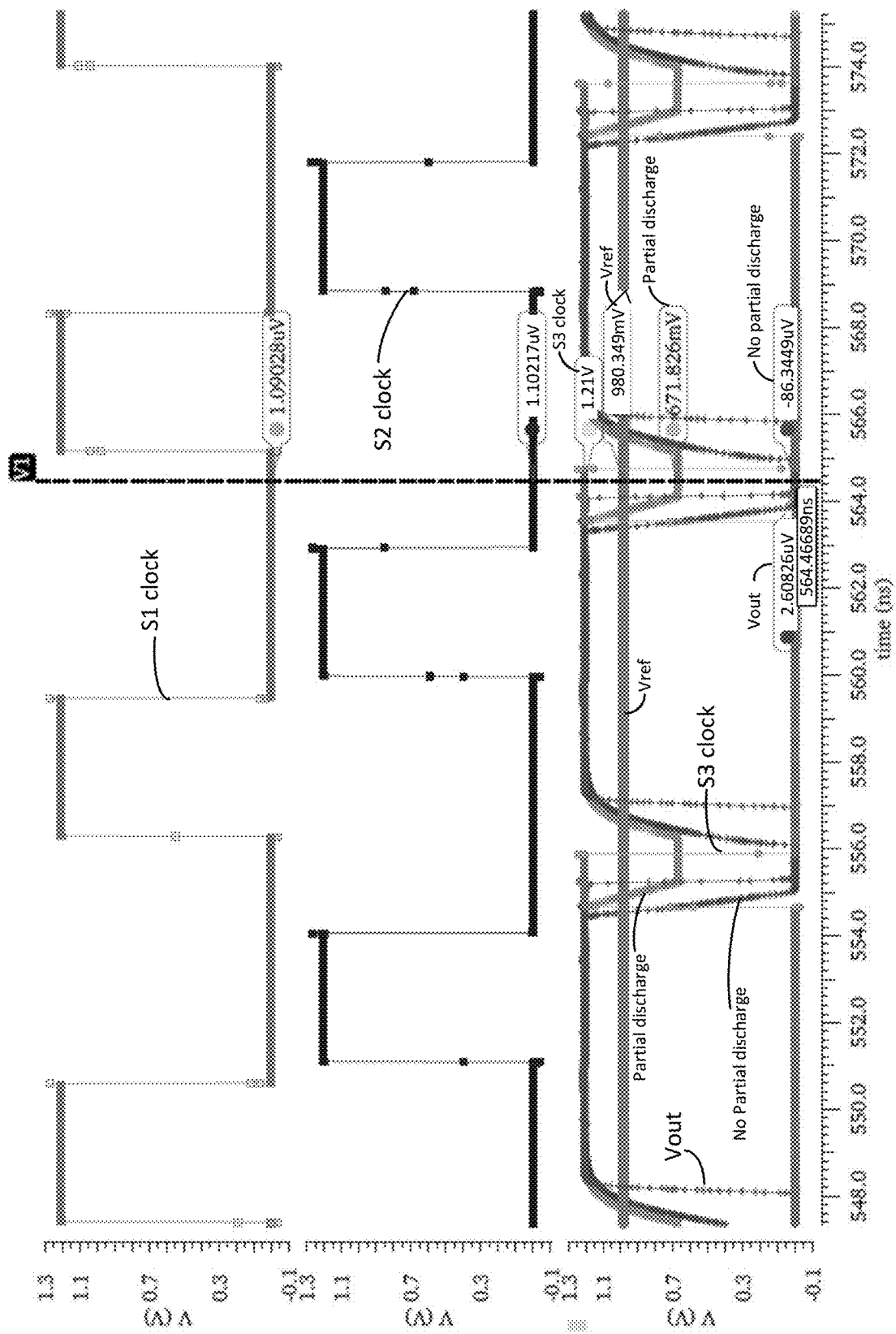
FIG. 8C illustrates a timing diagram and corresponding charge storage capacitor voltages and comparator output waveforms for the power distribution circuit of FIG. 8B using a variation tolerant inverter comparator.

FIG. 8A illustrates a power distribution circuit in which a partial discharge scheme is applied; FIG. 8B illustrates an implementation of the power distribution circuit of FIG. 8A using a voltage divider for the reference voltage; and FIG. 8C illustrates a timing diagram and corresponding charge storage capacitor voltages and comparator output waveforms for the power distribution circuit of FIG. 8B using a variation tolerant inverter comparator.

Referring to FIGS. 8A and 8B, a power distribution circuit 800 can be configured according to the switched capacitor circuit of FIG. 1B. In particular, the power distribution circuit 800 includes a critical capacitor 810, a shunt switch 820, a comparator 830, a first switch 840 controlled by S1 clock, a second switch 850 controlled by S2 clock, and a third switch 860 controlled by S3 clock. The comparator 830 can be configured as a variation tolerant inverter comparator, such as described with respect to variation tolerant inverter comparator 600 or variation tolerant inverter comparator 650. The inputs to the comparator 830 shown in FIG. 8A include the first supply rail (Vdd_supply), the second supply rail (Vss), and the critical capacitor voltage (Vdd_Capi), and a reference voltage (Vref). The critical capacitor voltage is input to the Vin_P input shown in FIG. 6A or 6B. Vref can be set using reference circuit element 870 coupled to the reference voltage stage (e.g., at reference voltage stage 605 of FIG. 6A or reference voltage stage 660 of FIG. 6B). Examples of reference circuit element 870 include a bandgap voltage reference circuit, a resistive voltage divider, and a capacitive voltage divider. In the example implementation of FIG. 8B, the reference voltage, Vref is set using a resistive potential divider 875 as the reference circuit element.

The transient waveforms of the different signals are similar to that shown in FIG. 5B. In particular, referring to FIG. 8C, S1 clock and S2 clock are independently shown, and the S3 clock is shown with the output of the variation tolerant inverter comparator (Vout) and Vdd_Capi waveform (for partial discharge and for full discharge for one of the PVT corners) in time domain. Advantageously, the partial discharge Vdd_Capi value for the partial discharge scheme for the described variation tolerant inverter comparator does not fall below 671.826 mV (with Vdd_Supply=1.21V and Vref=980.349 mV) during S3 turn-on phase. It should be understood that this is an example of the circuit operation, and the particular values can change depending on technology, PVT corners and specifications.

Unlike for the skewed inverter comparator implementation, Vref (indirectly the Vtrip of Input Stage Inverter) can be set dynamically during circuit operation. In the illustrated examples of the skewed inverter comparator, the Vtrip is set by design and cannot be changed to desired values later during operation. In contrast, the PVT variation of Vtrip (set by Vref) for the variation tolerant inverter comparator varies much less than in the skewed invertor comparator.

The particular implementation for the inverter stage can depend on the technology used, specifications, process-voltage-temperature corners, and design time available. In addition, power savings can be further improved when there are more relaxed specification with respect to frequency of operation (e.g., lower frequency can enable more power savings), operating temperature (e.g., lesser range of operating temperature can enable more power savings), and security requirements (e.g., a more relaxed security requirement can enable more power savings). The fabrication technology also has an impact on the circuit performance. For example, a threshold voltage control of MOSFETs on SOI technology using back-gate control can increase performance as compared to the example simulations. It should be further understood that while the specific examples presented herein show CMOS technology implementations, other technologies and topologies may be used.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A comparator circuit comprising:
an inverter stage with a trip voltage value (Vtrip) different than half a supply voltage value (VDD/2), wherein the trip voltage value represents a value that changes an output state of the inverter stage when crossed by both a rising input voltage and a falling input voltage to the inverter stage; and
a buffer stage coupled to an output of the inverter stage, wherein the inverter stage comprises a single reference voltage stage and an input stage,
wherein the single reference voltage stage comprises a first inverter coupled to receive a reference voltage and output a bias voltage, and
wherein the input stage comprises a second inverter matched to the first inverter, the second inverter coupled to receive an input voltage, the input stage being coupled to the reference voltage stage such that the bias voltage sets the trip voltage value of the input stage to different than VDD/2.

2. The comparator of claim 1, further comprising:
a first power gating transistor coupled between a first supply rail and the inverter stage; and
a second power gating transistor coupled between a second supply rail and the inverter stage.

3. The comparator circuit of claim 1, wherein the single reference voltage stage further comprises a first negative feedback loop from an output of the first inverter to control a pull-up network; and
a second negative feedback loop from the output of the first inverter to control a pull-down network.

4. The comparator circuit of claim 3, wherein the first negative feedback loop comprises a PMOS transistor of the first inverter, a pull-up compensation transistor, and an output node of the first inverter; and
wherein the second negative feedback loop comprises a NMOS transistor of the first inverter, a pull-down compensation transistor, and the output node of the first inverter.

5. The comparator circuit of claim 4, further comprising:
a first power gating transistor coupled between a first supply rail and the pull-up compensation transistor; and
a second power gating transistor coupled between a second supply rail and the pull-down compensation transistor.

6. The comparator circuit of claim 4, wherein the input stage further comprises a second pull-up compensation transistor coupled to receive the bias voltage from the single reference voltage stage and a second pull-down compensation transistor coupled to receive the bias voltage from the single reference voltage stage.

7. The comparator circuit of claim 4, wherein the input stage shares the pull-up compensation transistor and the pull-down compensation transistor with the single reference voltage stage.

8. The comparator circuit of claim 1, wherein the buffer stage comprises an odd number of buffers.

9. A power distribution circuit comprising:
a charge storage device; and
a comparator circuit coupled to the charge storage device to receive a voltage value of the charge storage device, wherein the comparator circuit comprises:
an inverter stage with a trip voltage value (Vtrip) different than half a supply voltage value (VDD/2), wherein the trip voltage value represents a value that changes an output state of the inverter stage when crossed by both a rising input voltage and a falling input voltage to the inverter stage; and
a buffer stage coupled to an output of the inverter stage, wherein the inverter stage comprises a single reference voltage stage and an input stage,
wherein the single reference voltage stage comprises a first inverter coupled to receive a reference voltage and output a bias voltage, and
wherein the input stage comprises a second inverter replicated and matched to the first inverter, the second inverter coupled to receive an input voltage, the input stage being coupled to the reference voltage stage such that the bias voltage sets the trip voltage value of the input stage to different than VDD/2; and
a shunt switch coupled to receive an output of the comparator circuit.

10. The power distribution circuit of claim 9, wherein the single reference voltage stage further comprises a first negative feedback loop from an output of the first inverter to control a pull-up network; and
a second negative feedback loop from the output of the first inverter to control a pull-down network.

11. The power distribution circuit of claim 9, further comprising a bandgap voltage reference circuit, a resistive voltage divider, or a capacitive voltage divider coupled to the reference voltage stage.

* * * * *